(12) United States Patent
Ohbayashi

(10) Patent No.: US 7,076,705 B2
(45) Date of Patent: Jul. 11, 2006

(54) SEMICONDUCTOR INTEGRATED CIRCUIT HAVING BONDING OPTIONAL FUNCTION

(75) Inventor: Shigeki Ohbayashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/242,876

(22) Filed: Oct. 5, 2005

(65) Prior Publication Data

US 2006/0059396 A1    Mar. 16, 2006

Related U.S. Application Data

(62) Division of application No. 09/196,136, filed on Nov. 20, 1998, now Pat. No. 6,976,200.

(30) Foreign Application Priority Data

Jun. 16, 1998  (JP) .................................. 10-168311

(51) Int. Cl.
*G01R 31/28* (2006.01)
(52) U.S. Cl. .................. 714/724; 327/313; 326/16
(58) Field of Classification Search ................ 714/724; 327/327–328, 313; 326/16; 365/230.03
See application file for complete search history.

(56) References Cited

U.S. PATENT DOCUMENTS

| | | | |
|---|---|---|---|
| 5,590,086 A * | 12/1996 | Park et al. .............. | 365/230.03 |
| 5,703,510 A | 12/1997 | Iketani et al. | |
| 5,767,694 A * | 6/1998 | Ogata .................... | 326/16 |
| 5,812,662 A | 9/1998 | Hsu | |
| 5,883,008 A | 3/1999 | McClure | |
| 5,929,685 A * | 7/1999 | Nam ...................... | 327/313 |
| 6,107,874 A | 8/2000 | Ohashi | |

FOREIGN PATENT DOCUMENTS

| | | |
|---|---|---|
| JP | 02-302987 | 12/1990 |
| JP | 06-005069 | 1/1994 |
| JP | 06-069425 | 3/1994 |

OTHER PUBLICATIONS

"BGA Packages, Gaining Popularity in U.S.; Make High Density Mounting of High Pin Count LSIs Easy", A. Fukuda, Nikkei Electronics, Feb. 14, 1994, pp. 59-73.
M5M5V1132FP, GP-6, -7, -8, -7L, -8L, Mitsubishi's Product Data Sheet Mar. 24, 1997, pp. 1-14.
Gallup et al (Testability features of the 68040: IEEE, Sep. 14, 1990).

* cited by examiner

*Primary Examiner*—Guy J. Lamarre
(74) *Attorney, Agent, or Firm*—McDermott Will & Emery LLP

(57) ABSTRACT

Current consumption of an input unit with respect to a bonding option pad is reduced, and erroneous operation of a circuit connected to this bonding option pad is prevented. A boundary scan test circuit is selectively set to an operable or disabled state by a control gate according to a signal from a function set circuit that sets the operation mode according to a potential of a bonding pad. By particularly controlling the operable and disabled state of an input circuit located at the first stage of the test circuit, power consumption can be reduced and erroneous operation while the test circuit is disabled is prevented.

7 Claims, 13 Drawing Sheets

FIG. 15  PRIOR ART

|   | 1    | 2    | 3     | 4     | 5     | 6    | 7    |
|---|------|------|-------|-------|-------|------|------|
| A | Vddq | SA   | SA    | SAP#  | SA    | SA   | Vddq |
| B | NC   | SE2  | NC    | SAC#  | NC    | SE3# | NC   |
| C | NC   | SA   | SA    | Vdd   | SA    | SA   | NC   |
| D | DQc  | DQPc | Vss   | NC    | Vss   | DQPb | DQb  |
| E | DQc  | DQc  | Vss   | SE1#  | Vss   | DQb  | DQb  |
| F | Vddq | DQc  | Vss   | G#    | Vss   | DQb  | Vddq |
| G | DQc  | DQc  | SBWc# | SADV# | SBWb# | DQb  | Vddq |
| H | DQc  | DQc  | Vss   | SGW#  | Vss   | DQb  | DQb  |
| J | Vddq | Vdd  | NC    | Vdd   | NC    | Vdd  | Vddq |
| K | DQd  | DQd  | Vss   | CK    | Vss   | DQa  | DQa  |
| L | DQd  | DQd  | SBWd# | NC    | SBWa# | DQa  | DQa  |
| M | Vddq | DQd  | Vss   | SBWE# | Vss   | DQa  | Vddq |
| N | DQd  | DQd  | Vss   | SA1   | Vss   | DQa  | DQa  |
| P | DQd  | DQPd | Vss   | SA0   | Vss   | DQPa | DQa  |
| R | NC   | SA   | LBO#  | Vdd   | FT#   | SA   | NC   |
| T | NC   | NC   | SA    | SA    | SA    | NC   | ZZ   |
| U | Vddq | TMS  | TDI   | TCK   | TDO   | TRST | Vddq |

119 SOLDER BALLS (BUMP) ALLOCATED IN 32K·32
SYNCHRONOUS BURST SRAM

| SIGNAL \ STATE | NC | H | L |
|---|---|---|---|
| 1FT(FT#) | NORMAL (PIPELINE) | NORMAL (PIPELINE) | FLOW THROUGH (NON-PIPELINE) |
| MODE(LB0#) | INTERLEAVE BURST | INTERLEAVE BURST | LINEAR BURST |
| ZZ | NORMAL | SNOOZE MODE | NORMAL |

SEMICONDUCTOR INTEGRATED CIRCUIT HAVING BONDING OPTIONAL FUNCTION

RELATED APPLICATION

This application is a divisional of application Ser. No. 09/196,136 filed Nov. 20, 1998 now U.S. Pat. No. 6,976,200.

BACKGROUND OF THE INVENTION

1. Field of the Invention

The present invention relates to semiconductor integrated circuits, and particularly to a semiconductor integrated circuit having a bonding option pin (or pad) differing in pad potential according to the sealed package type or available operation mode. More particularly, the present invention relates to the structure of an input circuit provided corresponding to the bonding option pin in such a semiconductor integrated circuit.

2. Description of the Background Art

In accordance with increase in integration density and function of a semiconductor integrated circuit, the number of input/output signals becomes greater to require more pin terminals to input/output the signals. A FP (Flat Package) having pin terminals arranged entirely around the package is employed to increase the number of pins. FIGS. 11A, 11B and 11C are a top view, front view, and a right side view, respectively, of a QFP (Quad Flat Package).

As shown in FIG. 11A, a QFP package has a rectangular feature, with pin terminals P arranged at the four sides thereof. The QFP package has a length of 20±0.1 mm, for example, in the direction of the longer side, and a length of 14±0.1 mm, for example, in the direction of the shorter side. An external pin terminal P has a length of approximately 2.0 mm. In FIG. 11A, a plurality of pin terminals P are arranged along all the longer and shorter sides. In the direction of the longer side, pin terminals with the pin numbers of #1–#30 and #51–#80 are arranged opposite to each other. In the shorter sides, pin terminals of pin numbers #31–#50 and #81–#100 are arranged opposite to each other.

As shown in FIGS. 11B and 11C, pin terminals P each have a gull wing shape (L shape). A pin terminal P is led out from the center area at the side surface of the package. The flat portion of the end of the L shape is substantially in flush with the bottom of the QFP package.

FIG. 11D shows an enlargement of a portion 30B of FIG. 1B. In FIG. 11D, pin terminal P is led out from the side surface of a package PK formed of sealing resin with its shape formed into a gull wing. The bottom portion (flat portion) of this pin terminal P is set to have an extremely small difference in height with the bottom of package PK. Therefore, the height of this QFP is as low as approximately 1.6 mm. Pin terminal P has the flat portion soldered to a wiring of a printed circuit board. The QFP is widely used as a surface-mount type package.

The pin terminal pitch of the QFP is, for example, 0.65 mm. The pin terminal pitch (the interval between pin terminals) becomes smaller as the number of pin terminals becomes greater. The pin terminal (lead terminal) is thin and easily deformed. In mounting the package on the printed circuit board, there is a possibility that the pin terminal is deformed to disable proper soldering to the printed circuit board (the pin terminal may be offset in position or short-circuited or damaged). A ball grid array type (BGA) package (solder ball array arrangement type package) having many terminals arranged without degrading the terminal pitch are beginning to be used for accommodating increase in the number of pin terminals.

FIGS. 12A, 12B, and 12C are the front view, right side view, and back surface view, respectively, of a ball grid array type package.

As shown in FIG. 12A, the ball grid array type package has a mold resin MR formed on a substrate BAS at the top surface thereof. A semiconductor integrated circuit is sealed by this mold resin MR. As shown in FIG. 12B, solder balls SB are arranged in alignment at the back surface of substrate BAS.

Solder balls SB are arranged in a matrix of rows and columns at the back surface of substrate BAS as shown in FIG. 12C. FIG. 12C shows an example of solder balls SB arranged in a matrix of columns 1–9 and rows A–U.

In the BGA (Ball Grid Array type) package, a solder ball SB has a diameter of approximately 0.76 mm. The pitch of the solder balls SB is approximately 1.27 mm. Solder ball SB has a height of approximately 0.60 mm. The package has a height of approximately 2.06 mm with solder ball SB included. The mold resin has a length of approximately 19.50 mm in the direction of the longer side and approximately 12.00 mm in the direction of the shorter side.

In a BGA package, solder ball SB formed at the back surface of substrate BAS is electrically connected to a solder pad formed on the printed circuit board.

In a BGA package, solder ball SB corresponds to a pin terminal in the QFP package. Therefore, the terminal pitch in a BGA package can be made larger than that of a QFP package. This means that more pin terminals can be arranged in a limited area, so that the package area can be reduced. Since solder ball SB is a hard ball, the possibility of deformation caused by contact is smaller in on-board-mounting. Since solder ball SB is electrically connected (reflow soldering) to the solder pad formed at the printed circuit board, the inductance of the lead terminal (pin terminal) is small.

However, there is a possibility that moisture adsorbed will be expanded by the reflow heat during reflow-soldering to cause detachment between the board or mold resin and the semiconductor integrated circuit chip, or to cause the generation of a crack in the mold resin and/or board. When the terminal pitch is excessively made small in a BGA package, the total number of wirings on the printed circuit board will increase to cause higher cost for the mounting board. Also due to the usage of a double-side printed circuit board for the BGA package the warp of the board induces variation in the height of the terminal in the package caused, to result in difference in contact degree of the solder balls.

Thus, the package for a semiconductor integrated circuit device is selected according to its usage, taking into account respective features of the QFP and BGA packages.

Consider a synchronous burst SRAM (Static Random Access Memory) as an example of a semiconductor integrated circuit. This synchronous burst SRAM allows continuous writing/reading of data of a predetermined burst length according to an externally applied clock signal.

FIG. 13 schematically shows an entire structure of a conventional synchronous burst SRAM. Referring to FIG. 13, synchronous burst SRAM 100 includes a memory array 102 with a plurality of static type memory cells arranged in rows and columns, an address register 104 taking in an address signal AD in synchronization with an externally applied clock signal CLK, a burst counter 106 taking in the least significant two bits of the address signal from address register 104 to sequentially change the input two bits at a predetermined sequence for output, and an address control circuit 108 taking in an address advance /ADV, an address status processor /ADSP, and an address status controller /ADSC in synchronization with clock signal CLK, to control the operation of address register 104 and burst counter 106 according to the status of these signals.

Address control circuit 108 causes burst counter 106 to carry out a count operation when address advance /ADV is at an L level at the rising edge of clock signal CLK. Address control circuit 108 causes address register 104 to input an externally applied address signal AD and burst counter 106 to stop its burst operation for taking in the least significant 2 bits of the address signal from address register 104.

The sequence of altering the input address signal bits in burst counter 106 is determined by a burst mode control MODE. By this burst mode control MODE, burst counter 106 carries out a linear burst operation of sequentially incrementing the input address by 1, or an interleaved burst operation of sequentially changing the more significant bit and less significant bit. In the synchronous burst SRAM, burst counter 106 carries out a count operation to change the address signal when address advance /ADV is at an L level at the rising edge of clock signal CLK. Therefore, an address signal is generated internally without applying an external address signal AD at each clock cycle to address a memory cell in memory array 102.

Synchronous burst SRAM 100 further includes a write control circuit 110 taking in a write enable control /WE and a chip select control /CS in synchronization with clock signal CLK, to perform control required for a write operation in synchronization with clock signal CLK, an input register 112 for taking in an externally applied data D (DQ) in synchronization with clock signal CLK under control of write control circuit 110, and a write circuit 114 for writing the data applied from input register 112 to an addressed memory cell in memory array 102 under control of write control circuit 110. Write control circuit 110 stops the write operation by an output enable /OE.

Write enable control /WE includes a master byte write /MBW to permit data writing in units of bytes, a global write /GW for writing simultaneously into the memory cells of all the bits (for example 32 bits), and byte write /BW1, /BW2, /BW3 and /BW4 to control data writing on a byte-by-byte basis. In a data writing operation, data writing can be controlled (masked) on a byte-by-byte basis. Therefore, input register 112 transfers internal write data on a byte-by-byte basis under control of write control circuit 110.

Synchronous burst SRAM 100 further includes an output control circuit 118 for generating an output control signal according to output enable /OE and the output signal of write control circuit 110, an output register 116 for reading out and latching the data of a selected memory cell in memory array 106, and an output buffer 120 for sequentially outputting the latched data of output register 116 under control of output control circuit 118.

Write control circuit 110 stops the write control operation at a next cycle to enable output control circuit 118 when output enable /OE attains an active state of an L level. Output control circuit 118 drives output buffer 120 from an output high impedance state to an output low impedance state according to output enable /OE under the enabled state to sequentially output the data read out from output register 116. Output register 116 responds to flow through /FT to transfer the read out data to output buffer 120 in a pipeline manner according to clock signal CLK, or to transfer the data read out from memory array 102 directly to output buffer 120 in a non-pipeline manner ignoring clock signal CLK. Snooze mode control ZZ is applied to each circuit to suppress the operation of each circuit when activated to reduce current consumption.

Synchronous burst SRAM 100 receives power supply voltage VDD and VSS as operating power supply voltages for the internal circuitry, and voltage VDDQ and VSSQ as the operating power supply voltages for the input/output buffer circuit. By providing power supply voltages VDDQ and VSSQ for use by the input/output buffer circuit separately from power supply voltages VDD and VSS for use by the internal circuit operation, variation in power supply voltages VDDQ and VSSQ, if occurring, in the input/output buffer operation, can be prevented from adversely affecting the internal circuit operation. Also, the input/output circuitry can be operated stably. Voltage VDDQ is approximately 1.8 V and voltage VDD is approximately 3.3 V. A signal can be transmitted speedily over the board.

To meet the requirement of the user developing a system or an electronic device using this synchronous burst SRAM, the synchronous burst SRAM may be sealed in a QFP package representative of a flat package or in a solder ball array arrangement type package having solder balls attached to the back surface of the package in an array, represented of a BGA package. A pin arrangements coping with both the packages of QFP and BGA are proposed by JEDEC (Joint Electron Device Engineering Council) so that both QFP and BGA packages can be used.

FIG. 14 shows the allocation of a signal with respect to each pin terminal in a QFP package. In FIG. 14, the pin arrangement of a 32K$t$ 36-bit synchronous burst SRAM is illustrated. In the region where pin terminals are arranged from pin number 1 to 30 in FIG. 14, data input/output bit DQ, flow through control FT# (/FT), and power supply voltages Vddq, Vssq, Vdd, Vss are allocated. The reason why the pin terminal receiving the power supply voltage is arranged between the pin terminals receiving the data bits is to supply a power supply voltage to the data input/output buffer circuitry stably. Flow through control FT# (/FT) is applied to the pin terminal of number 14.

Burst mode control LBO# (MODE) specifying the count sequence of the burst counter and an address signal AD (SA, SA1, SA0) are allocated to the pin terminals of numbers 31–50.

Data DQ and power supply voltages Vddq, Vssq, Vdd and Vss are allocated to the pin terminals of numbers 51–80. The allocation of the signals allocated to the pin terminals of numbers 51–80 is identical to that of the signals allocated to the opposite pin terminals of numbers 1–30. Snooze mode control ZZ is applied to the pin terminal of number 64. Snooze mode control ZZ functions to reduce the current consumption significantly by suppressing all the internal circuitry operation. According to the structure of the burst SRAM of FIG. 13, snooze mode control ZZ is applied to each circuit to fix the output signal level thereof.

Address signal AD and respective control signals are allocated to the pin terminals of numbers 81–100. Signals SE1#, SE2# and SE3# correspond to chip select /CS. Signals SBWd#, SBWc#, SBWb#, SBWa#, SGW# and SBWE# correspond to write enable control /WE. Signal G# corresponds to output enable /OE. Signal CK corresponds to clock signal CLK.

Signal SAC# corresponds to address status control /ADSC. Signal SAP# corresponds to address status processor /ADSP. Signal SADV# corresponds to address advance control #ADV.

By arranging data input/output pins at both sides of the package while arranging address signal AD and control signals at opposite sides, the memory array structure is made symmetrical to allow simplification of the internal layout.

FIG. 15 shows the signal allocation with respect to a solder ball (bump) in a BGA package. In the BGA package corresponding to FIG. 15, solder balls (bump) are arranged in 17 rows (rows A–U)×7 columns with signals allotted respectively. A the first column, data and power supply voltages are allocated. At the second column, addresses and data are allocated. At the third column, control signals, power supply voltages, and address signal bits are allocated. At the fourth column, control signals and power supply voltages are allocated. At the fifth column, control signals and address signal bits are allocated. At the sixth column, data and address signals are allocated. At the seventh column, data bits and power supply voltages are allocated. The label (reference character) of each signal is the same as shown in FIG. 14.

In FIGS. 14 and 15, reference character NC indicates "no connection". The corresponding pin terminal is not connected to a wire when mounted on a board.

In the allocation shown in FIG. 15, signals TMS, TDI, TCK, TDO and TRST are allocated at row U, which are the control signal, test clock signal, and test data signal used in a boundary scan test circuit. The reason why this boundary scan test and these signals data are allocated in a BGA package will be explained now.

FIG. 16 schematically shows a structure of a board formed by a test-designed chip according to the boundary scan design. Referring to FIG. 16, a plurality (in this case, 4) of semiconductor chips 152a, 152b, 152c and 152d are arranged on a board (printed circuit board) 150. Each of chips 152a–152d may be a semiconductor integrated circuit device that realizes the same logical function, or a semiconductor integrated circuit that realizes a function of a semiconductor memory device. Chip 152 (generically representative of chips 152a–152d) includes an input/output terminal 154 (generically representative of terminals 154a–154d) to input/output data that is to be processed or that is processed in a normal operation, a boundary scan register (BSR) 155 (generically representative of boundary scan registers 155a–155d) including at least the function to transmit test data, and an internal logic 153 (generically representative of internal logics 153a–153d; synchronous burst SRAM of FIG. 13, for example, corresponds to the same) for executing a desired logical operation.

Boundary scan register 155 is provided corresponding to each data input/output terminal (pad) 155. More specifically, boundary scan register 155 is provided corresponding to each input/output buffer. Also, boundary scan register 155 is connected in series to form a serial data shift path in one chip. The boundary scan register of each chip is connected in series via shift path 156. Accordingly, boundary scan registers 155 of chips 152a–152d forms one serial test data transfer path on board 150.

Input/output terminals 154a, 154b, 154c and 154d of chips 152a–152d, respectively, are connected to each other via system signal lines 157. A data signal that is to be processed or that is processed is delivered on system signal line 157 in a normal operation.

A board input/output terminal region (edge connector) 158 is provided on board 150 to transfer data between chip 152 on board 150 and another device external to board 150 (a chip on another board or test apparatus). Edge connector 158 includes input/output terminals 158a, 158b, and 158c for the input/output of process data SD in a normal operation at the board level, a scan-in terminal 159 receiving test data TDI, and a scan-out terminal 160 for providing test data TDO. Test data TDI applied to scan-in terminal 159 is transferred in series via the scan path formed of boundary scan registers 155 provided in each of chips 152a–152d. The scan-in test data TDI is set at a desired boundary scan register 155 by being sequentially transported via the boundary scan path.

Scan-out terminal 160 receives in series test data TDO transmitted via the scan path formed of boundary scan registers 155 provided in chips 152a–152d on board 150. Test data TDO can be read out from an arbitrary boundary scan register 155.

Boundary scan register 155 is provided corresponding to each input/output terminal 154 to shift applied test data, and to latch data from internal logic 153 or the data applied to input/output terminal 154.

The clock signal to control the shift operation of boundary scan register 155 is applied by a test clock signal TCK different from the system clock by which chips 152a–152d on board 150 operate. Since the test data transportation path is separated from the transportation path of system data (write/read data of memory, control signal, address signal), boundary scan register 155 can receive processed data of internal logic 153 without adversely affecting the operation of internal logic 153.

As shown in FIG. 16, by providing boundary scan registers in respective chips and connecting these registers to form a data transfer path, a particular chip 152 on board 150 can be directly accessed from edge connector 158 of board 150. Thus, a desired chip 152 on board 150 can be tested without using an expensive in-circuit tester. Furthermore, testing can be performed easily even in the case of a chip that is difficult to form contact between a test probe and a chip terminal such as in the case of a surface-mounted component.

Such a boundary scan test scheme using a boundary scan register includes an internal test, an external test, and a sample mode. In an internal test, desired data is set at a boundary scan register via the scan path to operate the internal logic. Determination is made on whether this internal logic operates properly or not. In an external test, a wiring between chips (line on board 150; system signal line 157) is tested. In external testing, the test data for confirming the connection is transmitted via shift path 156 to be retained in boundary scan register 155 connected to the output terminal of chip 152. This connection-confirmation test data is then applied to a corresponding output terminal. The test data applied to the output terminal is input to a boundary scan register connected to the input terminal of another chip. The data received by the boundary scan register is propagated on shift path 156 to be output from scan-out terminal 160. By observing this output data TDO, confirmation can be made on whether the interconnection of system signal line 157 between the chips is proper or not. By this external test, the open-and short-circuited states of lines between chips caused by chip line disconnection and defective soldering between a chip and a board can be tested.

For example, in chips 152a, 152b, 152c and 152d in FIG. 16, boundary scan register 155c of chip 152 is the boundary scan register connected to the output terminal. Boundary scan register 155a of chip 152a and boundary scan register 155d of chip 152d are boundary scan registers connected to the input terminal. In this case, the signal from the output terminal corresponding to boundary scan register 155 is applied to the input terminal corresponding to boundary scan registers 155a and 155d via system signal line 157.

The operation of testing the connection between boundary scan register 155c and boundary scan registers 155a and 155*d* will be described briefly now. First, connection-confirmation test data is sent to boundary scan register 155*c* via shift path 156 to be retained therein. The connection-confirmation test data retained in boundary scan register 155*c* is sent to boundary scan registers 155*a* and 155*d* of chips 152*a* and 152*d*, respectively, via a corresponding output terminal of chip 152*c* to be retained.

The connection-confirmation test data input to boundary scan registers 155*a* and 155*d* is output from scan-out terminal 160 via shift path 156. By observing data TDO output from scan-out terminal 160, the connection of signal line 157 between chips 152*a* and 152*d* and chip 152*c* is confirmed. This operation is performed on the input/output terminals between chips that are interfaced. By this test, interconnection failure between chips, i.e. the open-and short-circuited states caused by chip line disconnection and soldering defect between the chip and board, can be tested.

As to the above-described boundary scan test, a standard is proposed by the JTAG (Joint Test Action Group).

As shown in FIG. 12, BGA package has the solder balls arranged at the bottom of the package, so that the connection between the solder and the wire of the printed circuit board cannot be viewed. Also, the BGA package is a surface-mount type package, so that the pin (probe) of an in-circuit tester cannot attach the package pin. In a QFP package, the pin terminals are arranged at the surface of the printed circuit board as shown in FIG. 11A even though it is a surface mount type package. Therefore, the solder junction portion can be viewed. When a package passes an electrical characteristic test with a lead terminal merely placed on the solder and the junction not formed, such a defective junction can be found out by a visual inspection of the solder junction. In the case of a BGA package, visual inspection of the junction portion cannot be carried out since the terminal is located at the bottom of the package. Therefore, a boundary scan test circuit according to the above-described scan design method is provided in the semiconductor integrated circuit. By carrying out this boundary scan test after the BGA package is mounted on the printed circuit board, the short-circuited/open state of each line can be examined to assure reliability of the memory system after mounting.

Synchronous burst SRAM has to have the boundary scan test set to an executable state when sealed in a BGA package. When it is sealed in a QFP package, the boundary scan test is not required. Modification of the internal structure of a synchronous burst SRAM having a common function according to the type of the sealing package will degrade the design efficiency and fabrication efficiency. Therefore, a boundary scan test circuit is formed regardless of the type of the package to selectively connect a pad for the test circuit and a corresponding pin terminal depending upon the package type at the bonding step. Thus, a synchronous burst SRAM of the same function can be formed into a product through the same processings step by only modifying the bondings in the bonding step. As a result, the production efficiency and the design efficiency can be improved.

FIG. 17 schematically shows an entire structure of a conventional synchronous burst SRAM having a built-in test circuit. Referring to FIG. 17, the synchronous burst SRAM includes an input/output buffer group 160 arranged at the periphery, a boundary scan register group 165 with boundary scan registers provided corresponding to respective input and output buffers in input/output buffer group 160 to form a serial transfer path, a test control circuit 167 for effecting control of the boundary scan test, and an internal circuit 169 carrying out a predetermined function.

Test control circuit 167 sequentially transfers test input data TDI to boundary scan register group 165 according to externally applied test mode select signal TMS, test mode reset signal TRST, and test clock signal TCK through input/output buffer group 160 to carry out the test specified by test mode select signal TMS. Test result data TDO retained in the registers in boundary scan register group 165 are output sequentially by the shift operation of boundary scan register group 165 under control of test control circuit 167. Internal circuit 169 includes the circuit structure shown in FIG. 13.

The boundary scan test circuit formed of boundary scan register group 165 and test control circuit 167 is not coupled to an external terminal since a pin terminal is not allocated thereto when sealed in the QFP package. More specifically, the pads provided corresponding to signals TMS, TRST, TCK and data TDI and TDO are not connected to the external pin terminals. Therefore, it is necessary to prevent an unused boundary scan test circuit from operating erroneously and to prevent extra current from being consumed when sealed in the QFP package.

There is a signal having a pin terminal allocated independent of the package type, but has the connection between the pin terminal and a corresponding internal pad selectively established through a bonding wire or has the pin terminal fixed to a different potential, depending on the sealing package type. The operation mode to be carried out internally is determined by selective connection or selective setting of the pad potential in the step of making a bonding between a pin terminal and a corresponding pad. Such a pad is referred to as a "bonding option pad" hereinafter.

FIG. 18 shows an example of a signal related to a bonding option pad. In FIG. 18, three control signals are shown, i.e., a flow through signal /FT (FT#), a burst mode signal MODE (LBO#), and a snooze mode signal ZZ. When the pad corresponding to flow through signal /FT (FT#) is set at an H level or at an NC state, a normal mode (pipeline operation mode) is set in which data is output in synchronization with clock signal CLK. When flow through signal /FT (FT#) is fixed at an L level, the flow through mode (non-pipeline) is selected. The clock synchronized operation of the output register is ceased, and data is output statically. Here, an NC state indicates a state where a pad and a corresponding pin terminal is not connected by a bonding wire, or when a pin terminal is not connected to an internal line.

Burst mode signal MODE (LBO#) specifies an interleaved burst mode when the corresponding pad is set to an H level or an NC state and specifies a linear burst mode when the corresponding pad is fixed at an L level. In an interleaved burst mode, address signal (A1, A0) changes cyclically in the order of (A1, A0)→(A1, /A0)→(/A1, A0)→(/A1, /A0) in burst counter 106 of FIG. 13. In a linear burst mode, address bits (A1, A0) change cyclically in the order of (0, 0)→(0, 1)→(1, 0)→(1, 1) according to the value of the initially input address bits. Flow through signal /FT (FT#) and burst mode signal MODE (LBO#) have their pad potentials fixed in packaging or board-mounting, so that the states thereof will not change in a normal operation.

Snooze mode signal ZZ sets a normal operation mode when the corresponding pad is at an L level or an NC state, and sets a snooze mode when the corresponding pad is at an H level. In a normal operation mode, access is effected according to external clock signal CLK. In a snooze mode, the input/output buffer does not operate, so that the state of the internal circuit will not change independent of application of external clock signal CLK. Since the internal circuit does not operate and the potential level of the internal signal does not change when the snooze mode is set, a state where the power supply current is extremely low is set. In the case of snooze mode signal ZZ, a synchronous burst SRAM operable in a snooze mode and a synchronous burst SRAM disabled of the snooze mode operation are set by the absence/presence of bonding with respect to this pad.

In a semiconductor integrated circuit that includes only a required function among a plurality of functions, all the plurality of functions are implemented in the integrated circuit, and only the required function is set by the absence/presence of bonding/wiring to simplify the fabrication step, to shorten the turn around time, and to improve the design efficiency. The bonding option pad is set to a floating state, or bonded to the power supply line/ground line. In this case, the internal signal state must be set to a predetermined voltage level even in a floating state (NC state).

FIG. 19 shows an example of a structure of the input portion of the bonding option pad. Referring to FIG. 19, an input protection circuit formed of diodes D1 and D2, and a buffer circuit Bufa for buffering the potential of the signal on a pad PDa are provided with respect to pad PDa. Diode D1 has its anode connected to pad PDa and its cathode connected to a power supply node receiving power supply voltage VDD. Diode D2 has its cathode connected to pad PDa and its anode connected to ground node. A pull up resistor R1 is also provided with respect to pad PDa. Pull up resistor R1 pulls up the potential at the input portion of buffer Bufa to the level of power supply voltage VDD.

Pad PDa is selectively connected to a corresponding pin terminal PTa by a bonding wire BWa. A signal φph applied to pin terminal PTa is a burst mode signal LBO# (MODE) or flow through signal FT# (/FT) in the example of FIG. 18. When bonding wire BWa is not provided or when the pin terminal is at an NC state, the potential at the input of buffer Bufa is set to the level of power supply voltage VDD by pull up resistor R1. When pad PDa is connected to pin terminal PTa by bonding wire BWa, no current flows through pad PDa if signal φph is at an H level.

However, when signal φph is set at an L level, current i flows from pull up resistor R1 to the ground of pin terminal PTa through pad PDa and bonding wire BWa. Signal φph is either burst mode signal LBO# or flow through signal FT# and set to either an H or L level. Therefore, when pin terminal PTa is set to a logic level opposite to that set by pull up resistor R1, there is a problem that current flows from pull up resistor R1 to increase power consumption. Particularly in a standby state, this current attains a level that cannot be negligible even when the resistance value of pull up resistor R1 is large enough.

FIG. 20 shows another structure of the input portion with respect to a bonding option pad. Referring to FIG. 20, an input protection circuit formed of diodes D3 and D4, and a buffer Bufb are provided with respect to pad PDb. Diode D3 is connected in a forward direction from pad PDb to the power supply node. Diode D4 is connected in a reverse direction from pad PDb to the ground node. A pull down resistor R2 having a relatively large resistance is provided at the input of buffer Bufb.

Pad PDb is selectively connected to a corresponding pin terminal PTb via bonding wire BWb. A signal φpl applied to pin terminal PTb is, for example, a snooze mode signal ZZ. When bonding wire BWb is not provided and pin terminal PTb is disconnected from pad PDb or when pin terminal is at an NC state, the potential of pad PDb is maintained at the level of the ground voltage by pull down resistor R2. When pin terminal PTb and pad PDb are connected to each other by bonding wire BWb, current does not flow through pad PDb, bonding wire BWb and pin terminal PTb when signal φpl is at an L level. When signal φpl is at an H level, current flows from pin terminal PTb via bonding wire BWb, pad PDb and pull down resistor R2. In the case where signal φpl is a snooze mode signal ZZ, the device is operable in the snooze mode when pad PDb is connected to pin terminal PTb by bonding wire BWb. When the snooze mode is set, snooze mode signal ZZ is at an H level. Therefore, current flows from pin terminal PTb via pad PDb and resistor R2. Current will be consumed unnecessarily in a snooze mode implemented for reducing power consumption.

The above problem arises in the case where the function of the internal circuitry is set depending upon the presence/absence of pad bonding.

SUMMARY OF THE INVENTION

An object of the present invention is to provide a semiconductor integrated circuit that does not have current consumption increased in a circuit provided corresponding to a bonding option pad.

Another object of the present invention is to provide a semiconductor integrated circuit causing no erroneous operation of an input circuit provided corresponding to a bonding option pad.

A further object of the present invention is to provide a semiconductor integrated circuit causing no erroneous operation of a boundary scan test circuit selectively used according to the sealing package, even when the test circuit is not used (not connected to a pin).

Still another object of the present invention is to provide a semiconductor integrated circuit with a built-in boundary scan test circuit that does not operate erroneously when not used (not connected to pin terminal) and that has current consumption reduced.

A still further object of the present invention is to provide a synchronous burst SRAM with a built-in boundary scan test circuit that does operate non-erroneously with low power consumption.

According to an aspect of the present invention, a semiconductor integrated circuit includes a boundary scan test circuit for testing the mounted state of the semiconductor integrated circuit to a printed circuit board, a first pad having the potential level set according to whether the package in which the semiconductor integrated circuit is sealed is a surface-mount type flat package or a solder ball array arrangement type package, and a control circuit for fixedly setting the boundary scan test circuit to an operable or disabled state according to the potential of the first pad.

According to anther aspect of the present invention, a semiconductor integrated circuit includes a pad, a first transistor responsive to a power on detect signal to set the pad to the voltage level of a first logic level, an inverter for inverting the logic of the potential of the pad, and a second transistor provided in parallel to the first transistor, and receiving the output signal of the inverter at a control electrode node thereof. The operation mode of an internal circuit is set by the output signal of the inverter.

The boundary scan test circuit is fixedly set to either an operable state or a disabled state according to the sealing package type. By fixedly setting the boundary scan test circuit to an disabled state even when a bonding wire is not connected to the pad, erroneous operation of the boundary scan test circuit can be prevented to realize a semiconductor integrated circuit that operates stably.

The potential of the pad can be fixed by setting the pad potential to the predetermined potential level at the time of power on and latching the potential of the pad by the inverter and the second transistor. Therefore, the pad potential can be maintained stably at low current consumption. Since a pull up or pull down resistor is not used, the current path is cut off irrespective of the potential of the pin terminal even when the pad is connected to the pin terminal. Therefore, power consumption can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 shows the pin arrangement of a BGA array of a synchronous burst SRAM.

DESCRIPTION OF THE PREFERRED EMBODIMENTS

First Embodiment

Figure 1:
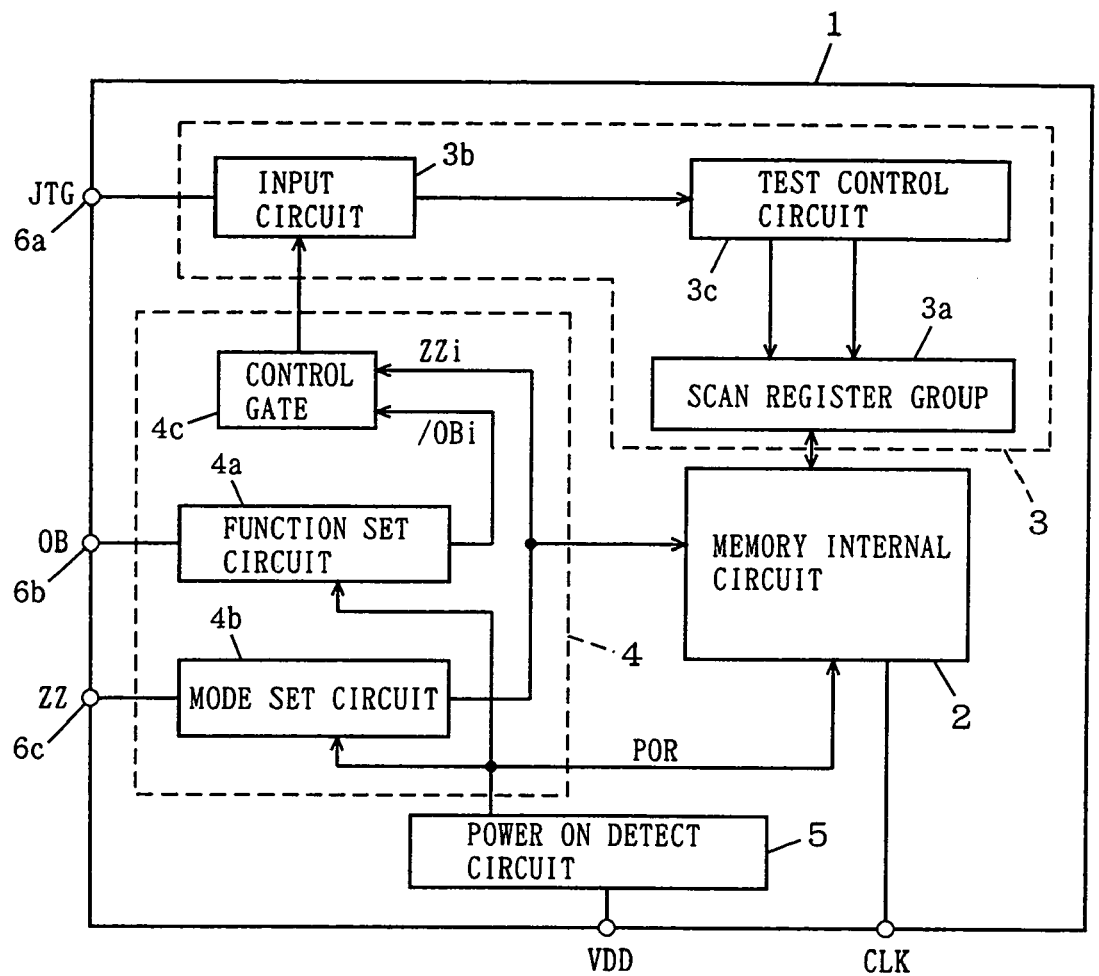
FIG. 1 schematically shows an entire structure of a semiconductor integrated circuit according to a first embodiment of the present invention.

FIG. 1 schematically shows an entire structure of a semiconductor integrated circuit according to a first embodiment of the present invention. Referring to FIG. 1, a semiconductor integrated circuit 1 includes a memory internal circuit 2 to carry out data input/output in synchronization with a clock signal CLK, a boundary scan test circuit 3 to test the electrical connection of a pin terminal of semiconductor integrated circuit 1, a control circuit 4 for setting boundary scan circuit 3 to an operable/disabled state, and a power on detect circuit 5 detecting application of power supply voltage VDD to output a power on detect signal POR.

Boundary scan test circuit 3 executes a test operation according to an input signal JTG applied to a pad 6a when operational. Control circuit 4 selectively sets boundary scan test circuit 3 to an operable state or disabled state according to the potential of pad 6b. Pads 6a–6c are bonding option pads. A bonding wire is selectively connected according to the sealing package type or an internal operation function mode. Here, a bonding option pad includes both a pad that has bonding between a pad and a pin terminal selectively made, and a pad that has wiring to a corresponding pin terminal selectively made. A bonding option pad has a programmable potential.

Figure 13:
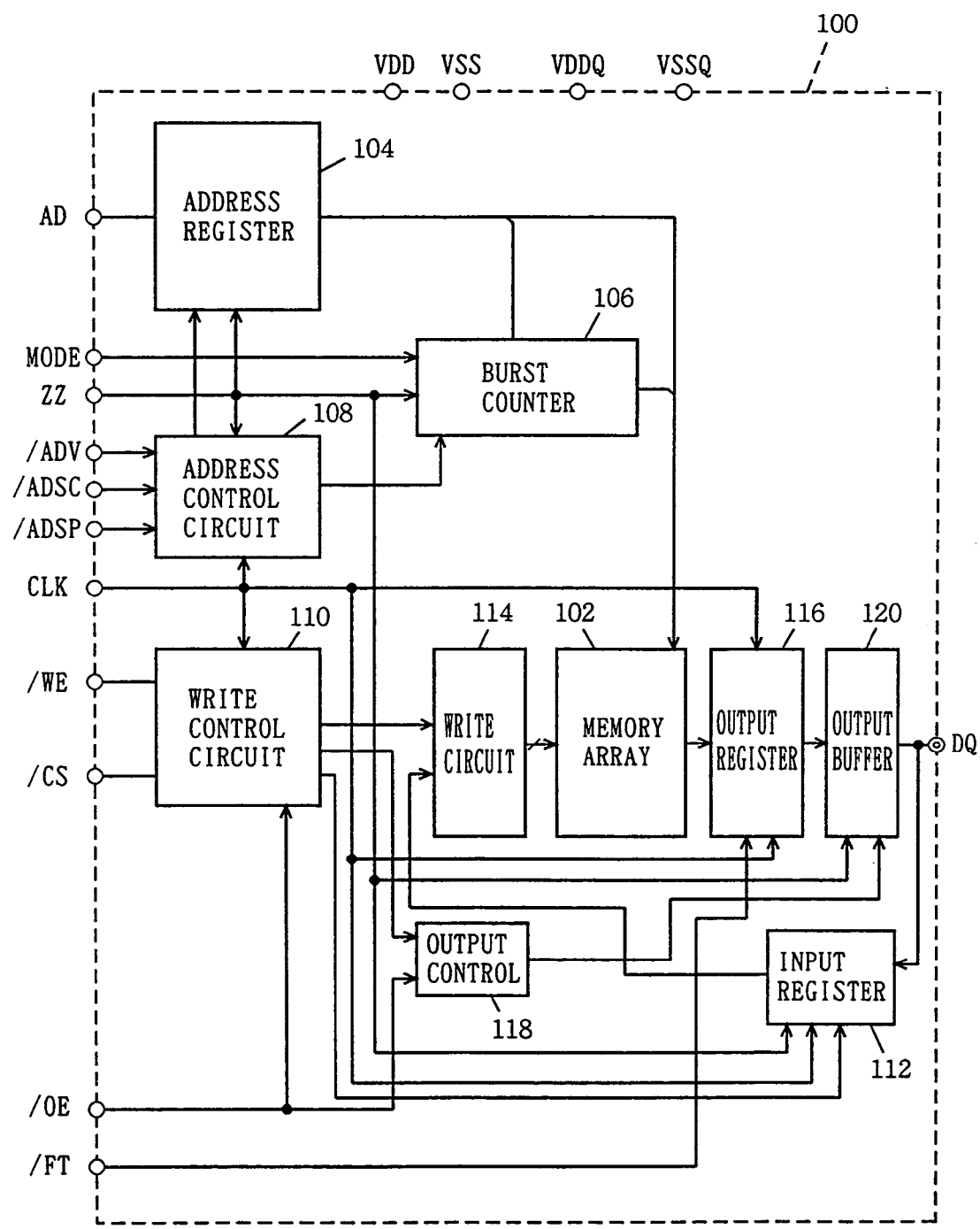
FIG. 13 schematically shows an entire structure of a conventional synchronous burst SRAM.
Figure 14:
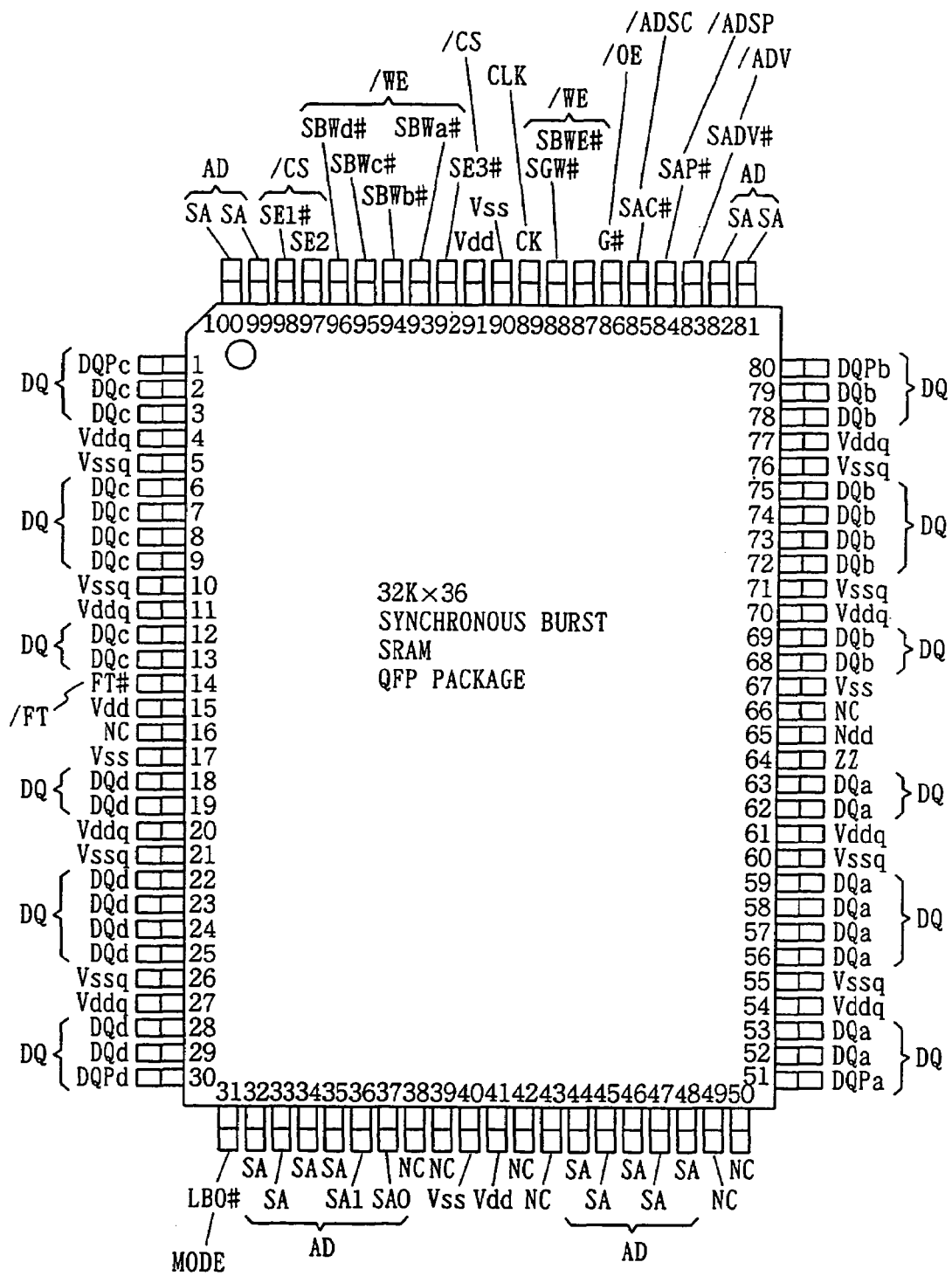
FIG. 14 shows the pin arrangement of a synchronous burst SRAM in a QFP package.
Figure 16:
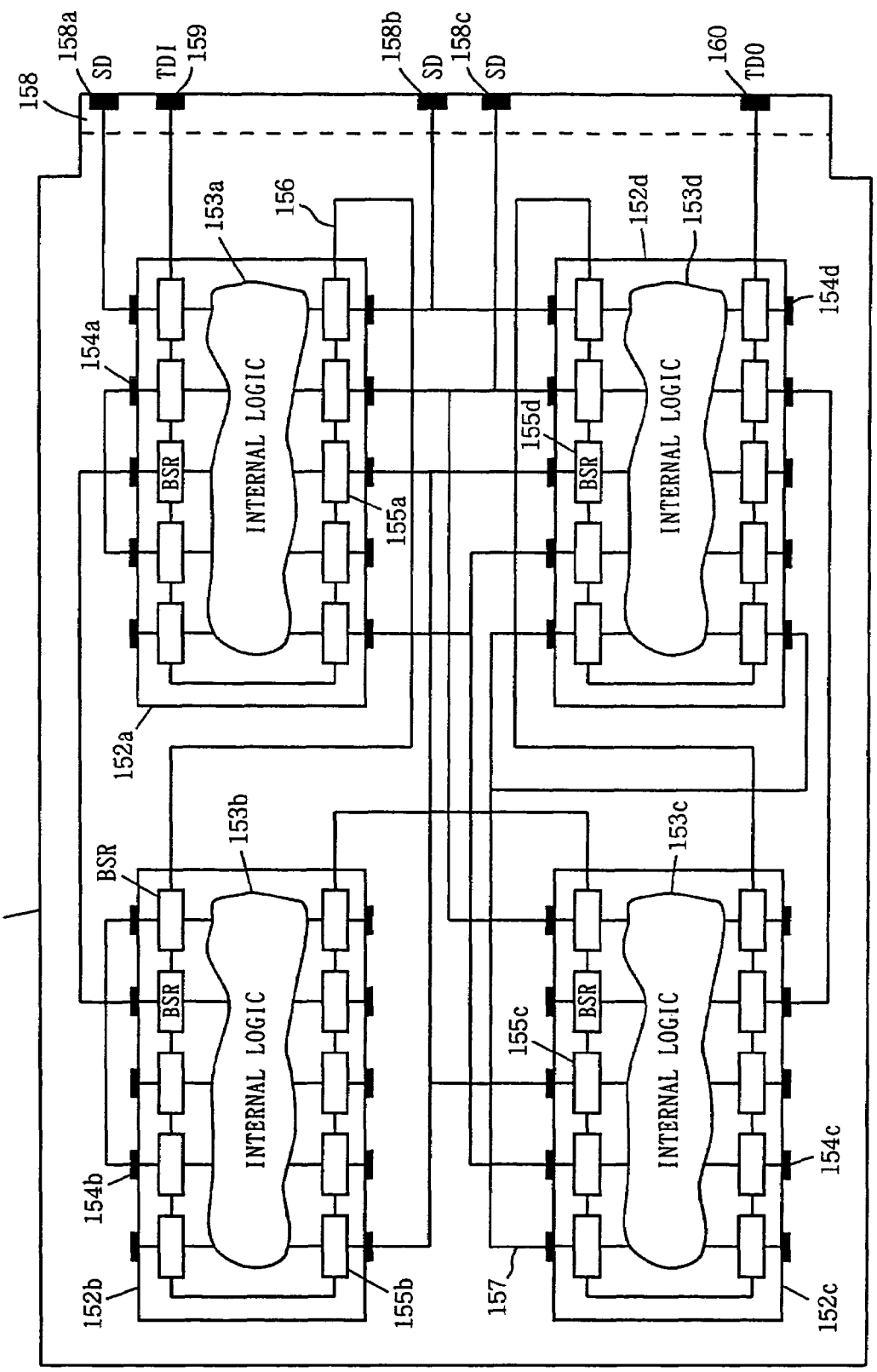
FIG. 16 is a diagram for depicting a conventional boundary scan test.
Figures 17, 18:
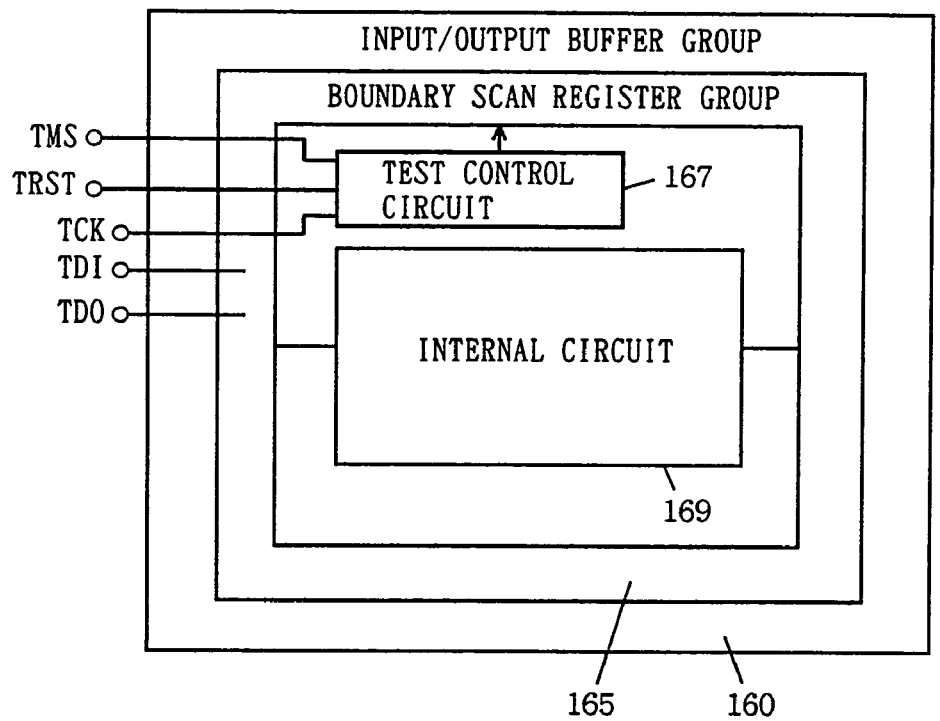
FIG. 17 schematically shows a structure of a semiconductor integrated circuit with a conventional boundary scan test circuit.
FIG. 18 is a list representing the relationship between the bonding option pin state of an operation mode set signal and the set operation mode in a synchronous burst SRAM.
Figure 19:
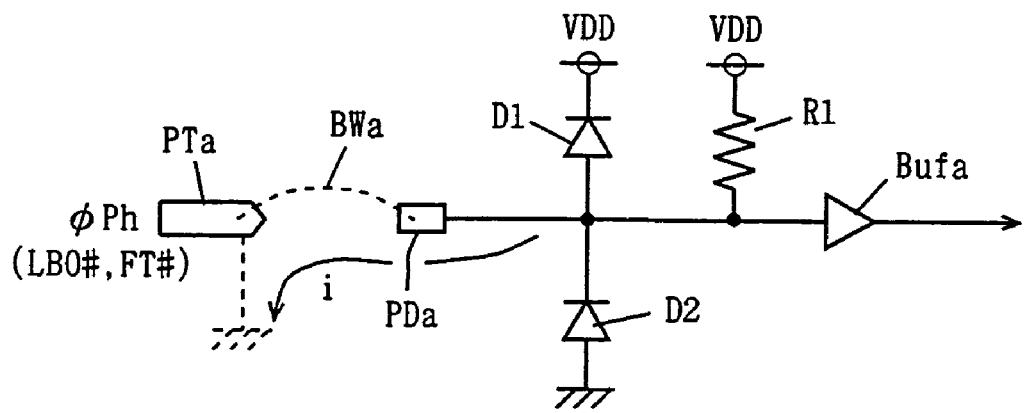
FIGS. 19 and 20 each show the structure of an input portion of a conventional bonding option pad.
Figure 20:
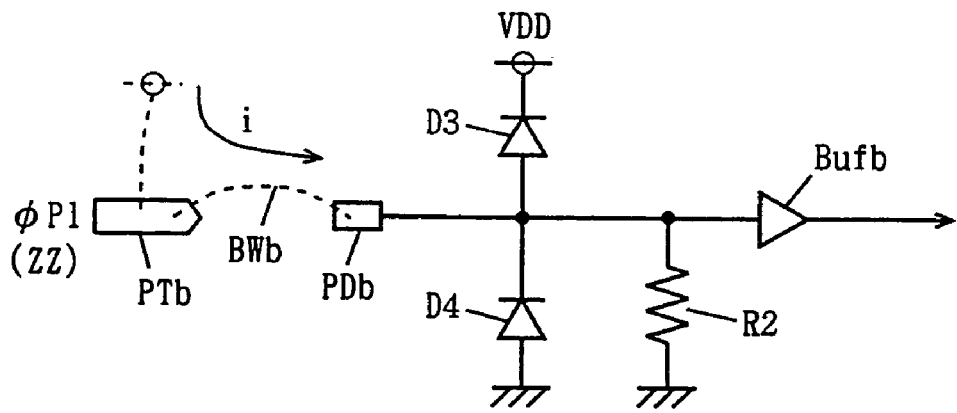

Memory internal circuit 2 has a structure similar to that shown in FIG. 13, and inputs an external signal (control signal, address signal, write data) in synchronization with clock signal CLK to output data in synchronization with clock signal CLK. Memory internal circuit 2 is operable in a burst mode, and can also be set to a flow through mode.

Boundary scan test circuit 3 includes a scan register group 3a having scan registers provided corresponding to respective input/output buffers of semiconductor integrated circuit 1, an input circuit 3b buffering signal JTG applied to pad 6a to generate an internal signal, and a test control circuit 3c controlling the operation of scan register group 3a according to the signal applied from input circuit 3b to carry out a boundary scan test. Scan register group 3a includes scan registers provided corresponding to respective input/output buffers (input buffer, output buffer, and input/output buffer)o f semiconductor integrated circuit 1, and forms a serial path to transfer a signal (data) in series. For the sake of simplification, scan register group 3a is indicated by on block in FIG. 1.

Control circuit 4 includes a function set circuit 4a responsive to the potential on pad 6b to set boundary scan test circuit 3 to an operable or disabled state, a mode set circuit 4b responsive to the potential of the signal on pad 6c to set the operation mode of memory internal circuit 2, and a control circuit 4c receiving an output signal/Obi of function set circuit 4a and an output signal ZZi of mode set circuit 4b to set the enable/disable (operable/inoperable) state of input circuit 3b of boundary scan test circuit 3. Mode set circuit 4b specifies either a snooze mode or a normal operation mode according to the potential of the signal on pad 6c. The reason why snooze mode designation signal ZZi from mode set circuit 4b is applied to control gate 4c to set boundary scan test circuit 3 operable/disable is to reduce current consumption by disabling input circuit 3b in the snooze mode when boundary scan test circuit 3 attains an operable state.

Pads 6a–6c receive externally applied signals JTG, OB and ZZ when connected to corresponding pin terminals. Signal JTG applied to pad 6a is defined in the JTAG boundary scan test standard, and includes a test clock signal TCK, test input data TDI, test mode select signal TMS, test mode reset signal TRST, and test output data TDO. An input circuit shown in FIG. 1 is provided for each signal. Test input data TDI is applied to test control circuit 3c via input circuit 3b to be sequentially transferred to scan register group 3a according to test mode signal TCLK under control of test control circuit 3c.

As shown in FIG. 1, by setting boundary scan test circuit 3 to an operable/disabled state and fixing the output signal level of input circuit 3b in the disabled state of the test circuit 3 according to the output signal of function set circuit 4a, current consumption is reduced without the occurrence of erroneous operation (because the potential is fixed, switching operable is no carried out, so that current is not consumed). By inhibiting the operation of input circuit 3b by snooze mode designation signal ZZi via control gate 4c when boundary scan test circuit 3 is set to an operable state, current consumption in a snooze mode can be reduced. Also, a boundary scan test can be executed properly in a normal operation mode. Thus, the erroneous operation of the boundary scan test circuit can be prevented and current consumption can be reduced in an disabled state.

Power on detect circuit 5 outputs a power on detect signal POR to initialize each internal node of semiconductor integrated circuit 1 to a predetermined potential level when power is turned on. The structure of each component will be now described.

Figure 2:
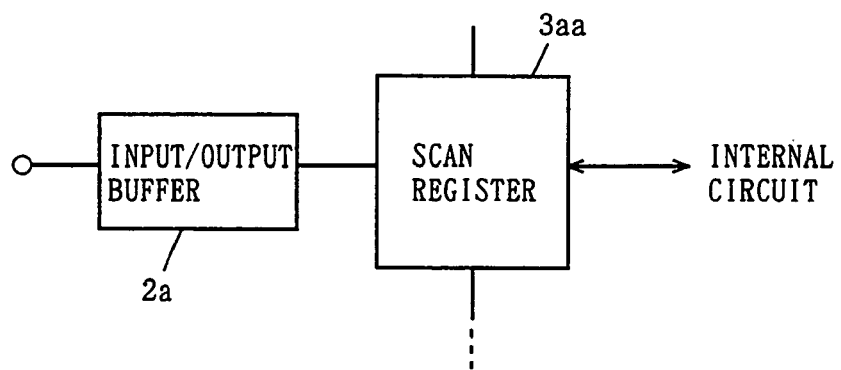
FIG. 2 schematically shows a structure of a scan register group of FIG. 1.

FIG. 2 shows a structure of one scan register in scan register group 3a. One scan register 3aa is provided with respect to input/output buffer 2a in memory internal circuit 2. Input/output buffer 2a is an input buffer, an output buffer, or an input/output buffer. When input/output buffer 2a takes the form of an input and output buffer, two scan registers are provided, i.e. a register for input and a register for output. Scan register 3aa is connected in series with a scan register not shown to form a serial transfer path to allow a signal (data) to be transmitted serially. In a normal operation mode, scan register 3aa is set to a through state, whereby signal/data is transferred between input/output buffer 2a and the internal circuit (refer to FIG. 32) via scan register 3aa.

The specific structure of scan register 3aa is arbitrary. Any structure is available as long as signal/data can be transferred serially in a test mode and a through state can be set where signal is transferred between an input/output buffer circuit and a corresponding internal circuit in a normal operation mode.

Figure 3:
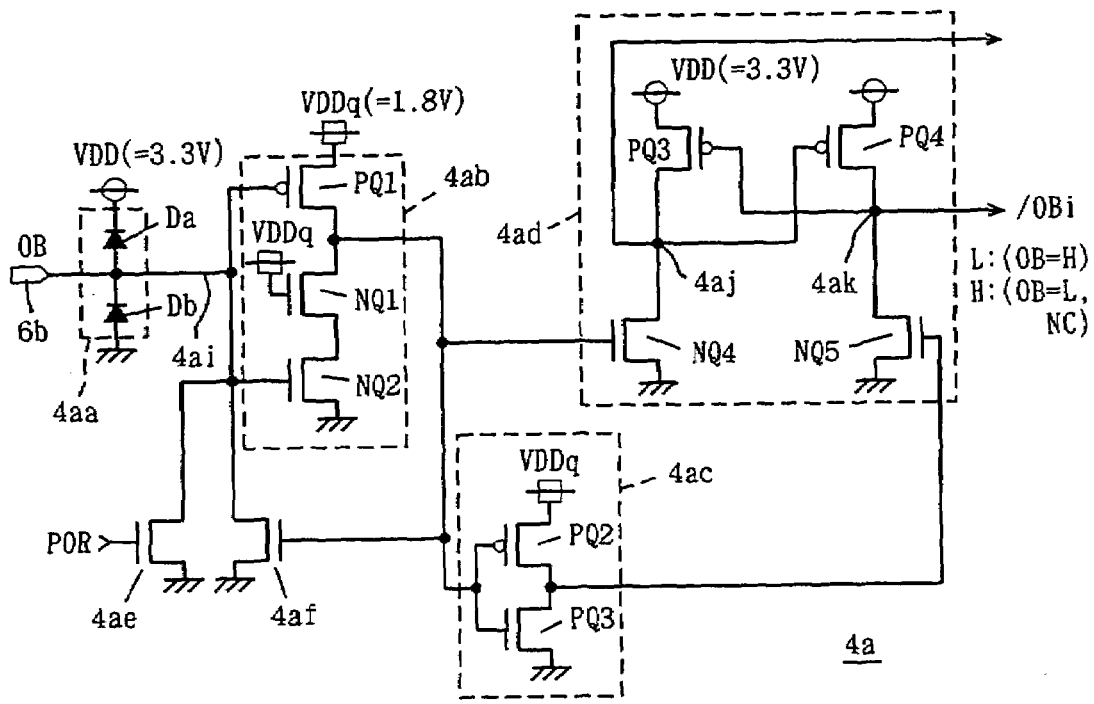
FIG. 3 shows an example of a structure of a function set circuit of FIG. 1.

FIG. 3 shows a structure of function set circuit 4a of FIG. 1. Referring to FIG. 3, function set circuit 4a includes an input protection circuit 4aa for preventing an excessive voltage applied to pad 6b from being transmitted internally, an inverter 4ab for inverting the potential of the signal on pad 6b, an inverter 4ac for inverting the output signal of inverter 4ab, a level conversion circuit 4ad for converting the level of the voltage of the output signal of inverter 4ab from power supply voltage VDDq(=1.8 V) to the level of internal power supply voltage VDD (=3.3 V) according to the output signals of inverters 4ab and 4ac, an n channel MOS transistor 4ae rendered conductive, when power on detect signal POR is active, to initialize an input node 4ai of inverter 4ab to the level of the ground potential, and an n channel MOS transistor 4af rendered conductive, when the output signal from inverter 4ab is at an H level, to discharge input node 4ai of inverter 4ab to the level of the ground potential.

Power supply voltage VDDq is one operating power supply voltage of the input/output buffer circuit. Power supply voltage VDD is the internal power supply voltage of the synchronous burst SRAM. In the processing system in which the synchronous burst SRAM is employed, the signal voltage of a wire on the board is set to 1.8 V to transmit a signal at high speed. The memory internal circuit can be operated at high speed by using power supply voltage VDD (=3.3 V) as the internal power supply voltage.

Input protection circuit 4aa includes a diode Da connected between pad 6b and the node receiving power supply voltage VDD, and a diode Db connected between pad 6b and the ground node. Diode Da is connected in the forward direction from pad 6b to the power supply node. Diode Db is connected in the forward direction from the ground node to pad 6b. Diode Da is rendered conductive when the voltage applied to pad 6b exceeds 3.3 V +Vf. Diode Db is rendered conductive when the voltage at pad 6b attains the level of −Vf. Here, Vf is the forward voltage drop of diodes Da and Db. When pad 6b is connected to an external pin terminal, only a voltage of approximately 1.8 V is normally applied. However, input protection circuit 4aa can pass a voltage up to approximately 3.3 V internally. Since input protection circuit 4aa is not bypassed in the forward direction even when a high voltage is applied, the current from the input pin terminal will not continuously flow via input protection circuit 4a. Therefore, even when a great voltage is generated to pad 6b by a noise or the like, no current will flow in input protection circuit 4aa as far as the voltage on pad 6b is less than 3.3 V. As a result, current consumption is reduced. Also, when a signal of an H level is applied when the mode is fixed, a voltage of 3.3 V or 1.8 V can be applied, and any of power supply voltage VDD and VDDq can be used therefor. This means that the degree of freedom of the board design can be increased.

Inverter 4ab includes a p channel MOS transistor PQ1 connected between the node receiving power supply voltage VDDq (=1.8 V) and an output node, and having a gate coupled to pad 6b, an n channel MOS transistor NQ2 receiving the signal on input node 4ai coupled to pad 6b at its gate, and having one conduction node connected to the ground node, and an n channel MOS transistor NQ1 connected between the output node and MOS transistor NQ2, and receiving power supply voltage VDDq at its gate. MOS transistor NQ1 has a gate coupled to receive power supply voltage VDDq (=1.8 V), and operates in a resistance mode. MOS transistor NQ1 serves as a current limiting element to prevent a large current from flowing through inverter 4ab.

Inverter 4ac includes a p channel MOS transistor PQ2 and an n channel MOS transistor NQ3 connected between the power supply node receiving power supply voltage VDDq and the ground node. MOS transistors PQ2 and NQ3 have their gates connected to the output node of inverter 4ab.

Level conversion circuit 4ad includes an n channel MOS transistor NQ4 connected between a node 4aj and the ground node and receiving the output signal of inverter 4ab at its gate, an n channel MOS transistor NQ5 connected between a node 4ak and the ground node and receiving the output signal of inverter 4ac at its gate, a p channel MOS transistor PQ3 connected between the power supply node receiving power supply voltage VDD and node 4aj and having a gate connected to node 4ak, and a p channel MOS transistor PQ4 connected between the node receiving power supply voltage VDD and node 4ak and having a gate connected to a node 4aj.

When the output signal of inverter 4ab is at an H level, MOS transistor NQ4 is turned on and MOS transistor NQ5 is turned off. Node 4aj is discharged to the level of the ground potential via MOS transistor NQ4. In response to reduction of the potential at node 4aj, the conductance of p channel MOS transistor PQ4 becomes greater, whereby node 4ak is charged to the level of power supply voltage VDD. In response to the increase of the potential at node 4ak, the conductance of MOS transistor PQ3 becomes smaller, whereby the voltage drop at node 4*aj* to the level of the ground potential and the voltage increase at node 4*ak* to the level of power supply voltage VDD are carried out at high speed. Eventually, node 4*ak* attains the level of power supply voltage VDD, and node 4*aj* attains the level of the ground voltage. Internal function set signal /OBi is generated from node 4*ak*.

When the output signal of inverter 4*ab* is at an L level, MOS transistor NQ4 is turned off and MOS transistor NQ5 is turned on. Node 4*ak* attains an L level of the ground voltage, and node 4*aj* attains an H level of the power supply voltage VDD. Level conversion circuit 4*ad* converts the level of the output signal of inverter 4*ab* from the level of voltage VDDq to the H level of internal power supply voltage VDD (=3.3 V) to generate internal function set signal /OBi.

Thus, an internal circuit that operates receiving power supply voltage VDD as one operating power supply voltage can be operated correctly (here, the internal circuit includes memory internal circuit 2 and control gate 4*c*). Level conversion circuit 4*ad* is a latch circuit formed of p channel MOS transistors PQ3 and PQ4. Following the arrival of nodes 4*aj* and 4*ak* in potential at an H level (power supply voltage VDD) and an L level (ground voltage), the voltage levels of nodes 4*aj* and 4*ak* are latched by MOS transistors PQ3 and PQ4 to cut off the path where the through current flows. As a result, current consumption is reduced. The operation of function set circuit 4*a* of FIG. 3 will now be described.

(i) Sealed in BGA Package:

When sealed in a BGA package, the boundary scan test circuit of the synchronous burst SRAM must be set to an operable state. Pad 6*a* receiving signal JTG related to the boundary scan test is connected to a corresponding pin terminal. In this case, pad 6*b* is bonded such that its potential is at an H level. When signal OB of pad 6*b* is set at an H level (this H level can be either power supply voltage VDD or VDDq), the output signal of inverter 4*ab* attains an L level, whereby internal function set signal /OBi output from level conversion circuit 4*ad* attains an L level. MOS transistor 4*af* is turned off by the L level signal from inverter 4*ab*. MOS transistor 4*ae* is turned on only for a predetermined period of time when the power is turned on according to power on detect signal POR. Therefore, even when pad 6*b* is fixed to the potential level of an H level, current flows only for a short period of time via MOS transistor 4*ae* when the power is turned on. When power on detect signal POR is pulled down to an L level, MOS transistor 4*ae* is turned off. Therefore, the current path with respect to pad 6*b* is cut off, so that no current is consumed.

(ii) Sealed in QFP Package:

When sealed in a QFP package, boundary scan test circuit 3 of FIG. 1 is not used. Also, pad 6*a* provided corresponding to input circuit 3*b* is not connected to an external pin terminal. Pad 6*b* is not bonded and set to an NC state, or bonded so as to be fixed to an L level. When fixed to an L level, the output signal of inverter 4*ab* attains an H level. Also, internal function set signal /OBi from level conversion circuit 4*ad* attains an H level of power supply voltage VDD. In response to the output signal of inverter 4*ab* attaining an H level, MOS transistor 4*af* is turned on, whereby the voltage of input node 4*ai* of inverter 4*ab* is maintained at the ground voltage level. Under this state, a latch circuit is formed by inverter 4*ab* and MOS transistor 4*af*, whereby pad 6*b* (input node 4*ai*) is reliably maintained at the level of the ground voltage. Also, there is no current path.

When pad 6*b* is at an NC state and not connected to a pin terminal, input node 4*ai* is driven to the level of the ground voltage by MOS transistor 4*ae* since power on detect signal POR attains an H level for a predetermined time when power is turned on. When input node 4*ai* is initialized to an L level, the output signal of inverter 4*ab* rises according to the rising level of power supply voltage VDDq. MOS transistor 4*af* is turned on, and input node 4*ai* is discharged to the level of the ground voltage. As a result, a latch circuit is formed by inverter 4*ab* and MOS transistor 4*af*, whereby input node 4*ai* and pad 6*b* are set to the level of the ground voltage. Therefore, even in an NC state, there is no path through which current flows, so that current consumption can be reduced. Furthermore, since no pull up or pull down resistor is used, no through current will flow through such resistors. Therefore, power consumption is reduced.

As described above, function set signal /OBi from function set circuit 4*a* is set at an L level when sealed in a BGA package and set to an H level when sealed in a QFP package. The logic level differs depending upon the sealing package type. Thus, the boundary scan test circuit can be set to an operable/disabled state according to the potential of pad 6*b* according to the type of the sealed package.

The pin terminal to which bonding pad 6*b* is connected is a power supply pin terminal when the pad 6*b* is set to an H level and a pin terminal receiving the ground voltage when set to an L level. When pad 6*b* is connected to a pin terminal externally, the corresponding pin terminal can be fixed to the level of the power supply voltage or the ground voltage by an external source. Furthermore, the potential of pad 6*b* can be fixed simply by mask interconnection.

Figure 4:
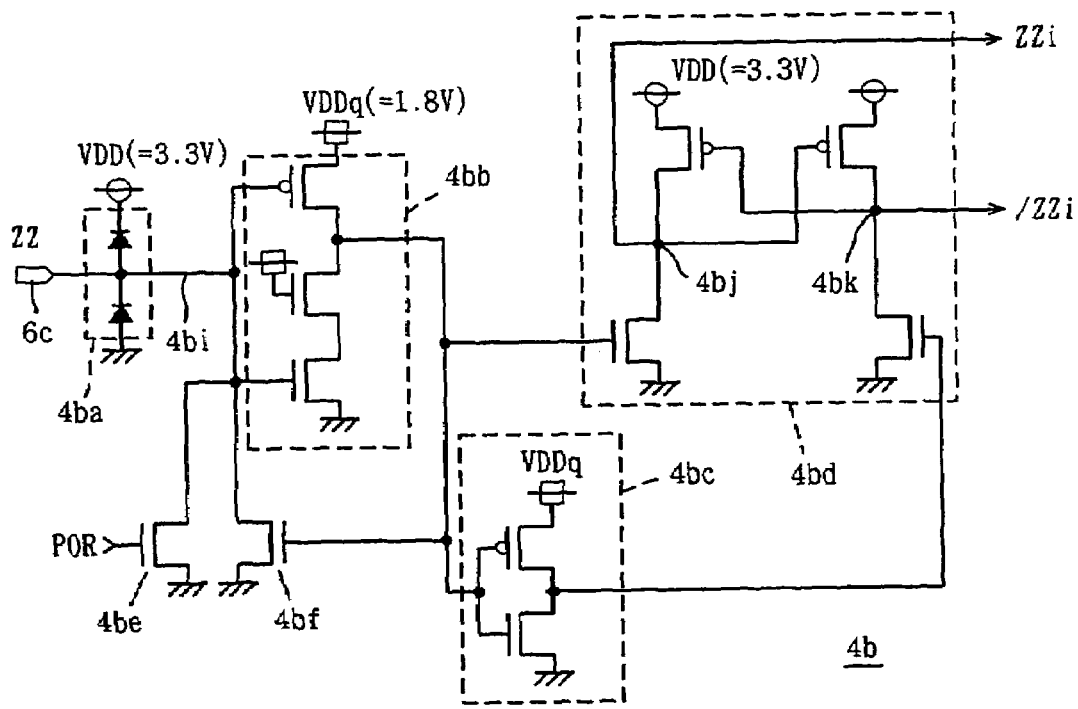
FIG. 4 shows an example of a structure of a mode set circuit of FIG. 1.

FIG. 4 shows an example of a structure of mode set circuit 4*b* of FIG. 1. Referring to FIG. 4, mode set circuit 4*b* includes an input protection circuit 4*ba* for protecting the internal circuit against excessive voltage of pad 6*c*, an inverter 4*bb* for inverting the logic of a signal ZZ on pad 6*c*, an inverter 4*bc* for inverting the output signal of inverter 4*bb*, a level conversion circuit 4*bd* converting the level of the output signal of the inverter 4*bb* according to the output signals of inverters 4*bb* and 4*bc*, an n channel MOS transistor 4*be* responsive to power on detect signal POR to discharge input node 4*bi* of inverter 4*bb* to the level of the ground voltage, and an n channel MOS transistor 4*bf* responsive to the output signal of inverter 4*bb* to discharge input node 4*bi* of inverter 4*bb* to the level of the ground voltage.

Inverters 4*bb* and 4*bc* operate with power supply voltage VDDq (=1.8 V) being one operating power supply voltage. Input protection circuit 4*ba* and level conversion circuit 4*bd* operate with power supply voltage VDD (=3.3 V) being one operating power supply voltage. The structure of mode set circuit 4*b* of FIG. 4 differs from the structure of function set circuit 4*a* of FIG. 3 only in that the signal applied to the pad differs. More specifically, snooze mode signal ZZ is applied to pad 6*c*, and internal snooze mode designation signal /ZZi is output from node 4*bk* of level conversion circuit 4*bd*. Internal snooze mode designation signal ZZi is output from node 4*bj*. The operation of mode set circuit 4*b* of FIG. 4 is similar to the operation of function set circuit 4*a* of FIG. 3. Mode set circuit 4*b* functions to set whether the synchronous burst SRAM is to operate according to the snooze mode or not. When a snooze mode is not employed, pad 6*c* is fixed to an L level or set at an NC state (the corresponding pin terminal may be at an NC state). In this state, the voltage at input node 4*bi* is pulled down to an L level. Internal snooze mode designation signal ZZi attains an L level. Memory internal circuit 2 (refer to FIG. 1) operates in a normal operation mode.

In order to allow a snooze mode operation, pad 6c is connected to a corresponding pin terminal. Snooze mode designation signal ZZ is applied at L level and at an H level in a normal operation mode and a snooze mode, respectively, to the external pin terminal. When a snooze mode signal ZZ of an H level is set, input node 4bi attains an H level. Internal snooze mode designation signal ZZi is driven to an H level, whereby memory internal circuit 2 is set to a snooze mode. Therefore, the operation is ceased.

The mode set circuit of FIG. 4 has a structure similar to that of function set circuit 4a of FIG. 3. Therefore, the internal node can be set to a predetermined voltage level stably at low current consumption.

It is to be noted that pad 6c is always connected to a corresponding pin terminal (ZZ pin). The pin terminal may be set at an NC state, an L level fixed state, or an H/L state. This is because a pin terminal for the snooze mode is allocated in both packages of QFP and BGA. This feature differs from function set circuit 4a of FIG. 3. A pin terminal does not have to be allocated to signal /OB.

Figure 5:
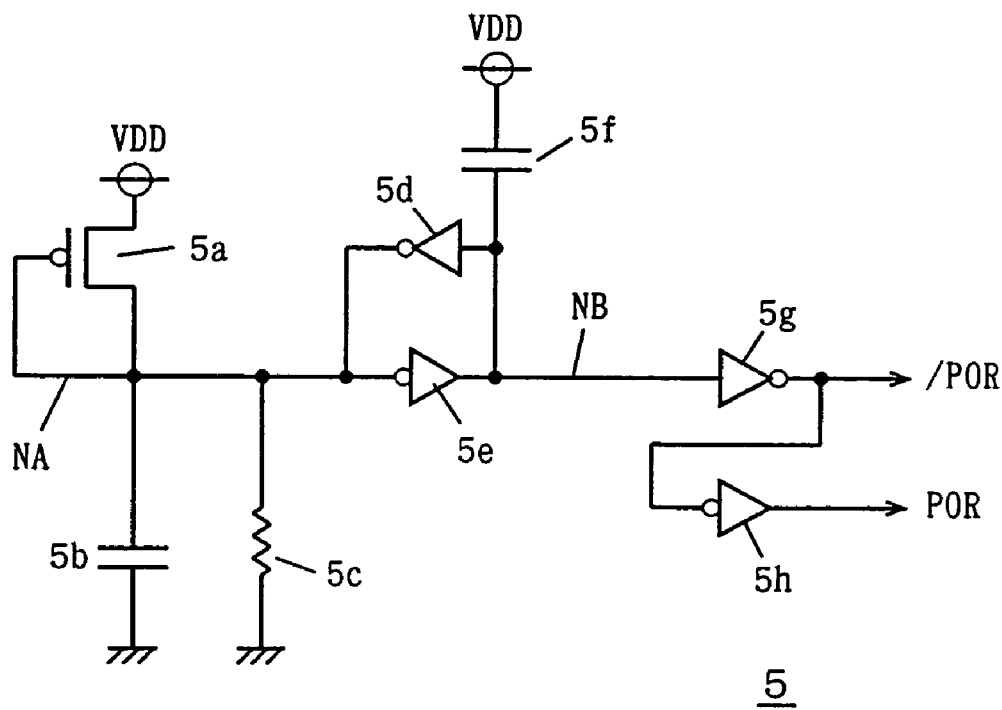
FIG. 5 shows an example of a structure of a power on detect circuit of FIG. 1.
Figure 6:
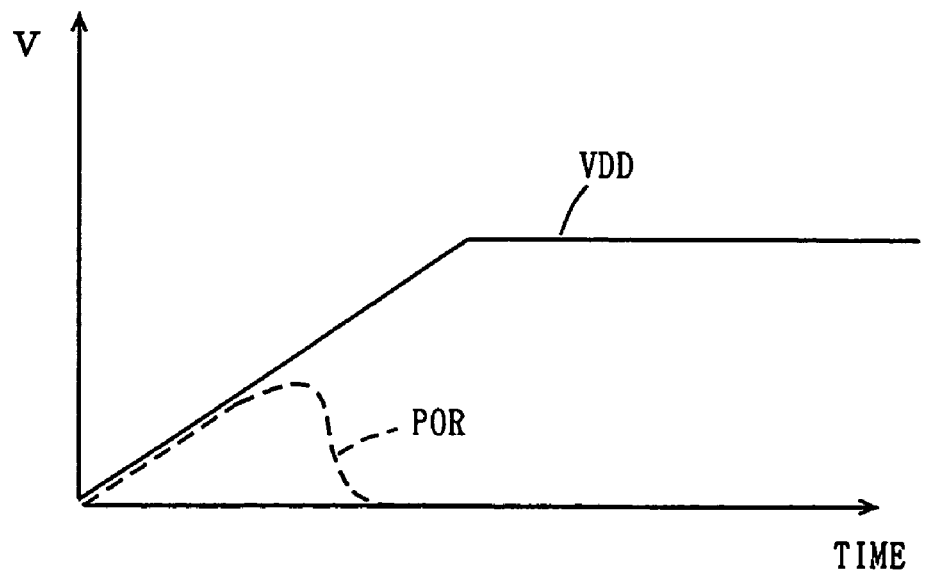
FIG. 6 is a signal waveform diagram representing an operation of the power on detect circuit of FIG. 5.

FIG. 5 shows an example of a structure of power on detect circuit 5 of FIG. 1. Referring to FIG. 5, power on detect circuit 5 includes a p channel MOS transistor 5a connected between the power supply node receiving power supply voltage VDD and a node NA and having a gate connected to node NA, a capacitor 5b connected between node NA and the ground node, a resistor 5c of high resistance connected between node NA and the ground node, an inverter 5e for inverting the logic of the potential of node NA for transmission to a node NB, an inverter 5d for inverting the output signal of inverter 5e and transmitting the inverted signal to inverter 5e, a capacitor 5f connected between the node receiving power supply voltage VDD and node NB, an inverter 5g for inverting the signal of node NB to generate a complementary power on detect signal /POR, and an inverter 5g for inverting the output signal of inverter 5g to generate power on detect signal POR. Inverters 5d and 5e form a latch circuit. Inverter 5d is made to have a small current drivability. The operation of power on detect circuit 5 of FIG. 5 will be described with reference to the waveform diagram of FIG. 6.

Before power is turned on, nodes NA and NB are at the level of the ground voltage. Also, inverters 5g and 5h output a signal of an L level. Upon the power being turned on, the level of power supply voltage VDD increases. MOS transistor 5a is diode-connected and supplies current towards node NA. Capacitor 5b and resistor 5c are connected to node NA, so that the voltage at node NA slowly rises. The charging of this node NA is initiated after power supply voltage VDD becomes higher than the absolute value of the threshold voltage of MOS transistor 5a. Node NB is coupled to the power supply node by capacitor 5f. Node NB increases in voltage by the capacitive coupling of capacitor 5f according to the increase of power supply voltage VDD. As a result, the H level of node NB and the L level of node NA are latched by inverters 5e and 5d. Since node NB is latched at the H level, power on detect signal POR output from inverter 5h increases in voltage according to the rise of power supply voltage VDD.

When node NA is charged by MOS transistor 5a so that the charging potential of capacitor 5b becomes higher than the input logic threshold of inverter 5e (the current drivability of transistor 5a is greater than that of inverter 5d), the voltage level of node NB is driven to an L level by inverter 5e. In response, power on detect signal POR output from inverter 5h is driven to an L level. In this state, node NA is latched at an H level by inverters 5e and 5d, and the voltage level thereof rises according to the time constant determined by capacitor 5b and resistor 5c.

Power on detect signal POR maintains an H level until power supply voltage VDD exceeds a certain voltage level when power is turned on. Therefore, MOS transistors 4ae and 4bb shown in FIGS. 3 and 4 are turned on during the period of power on detect signal POR attaining a level higher than the threshold voltage of MOS transistors 4ae and 4be. The corresponding nodes 4ai and 4bi are discharged to the ground voltage level. As a result, each internal node can be initialized properly to a predetermined voltage level.

Figure 7:
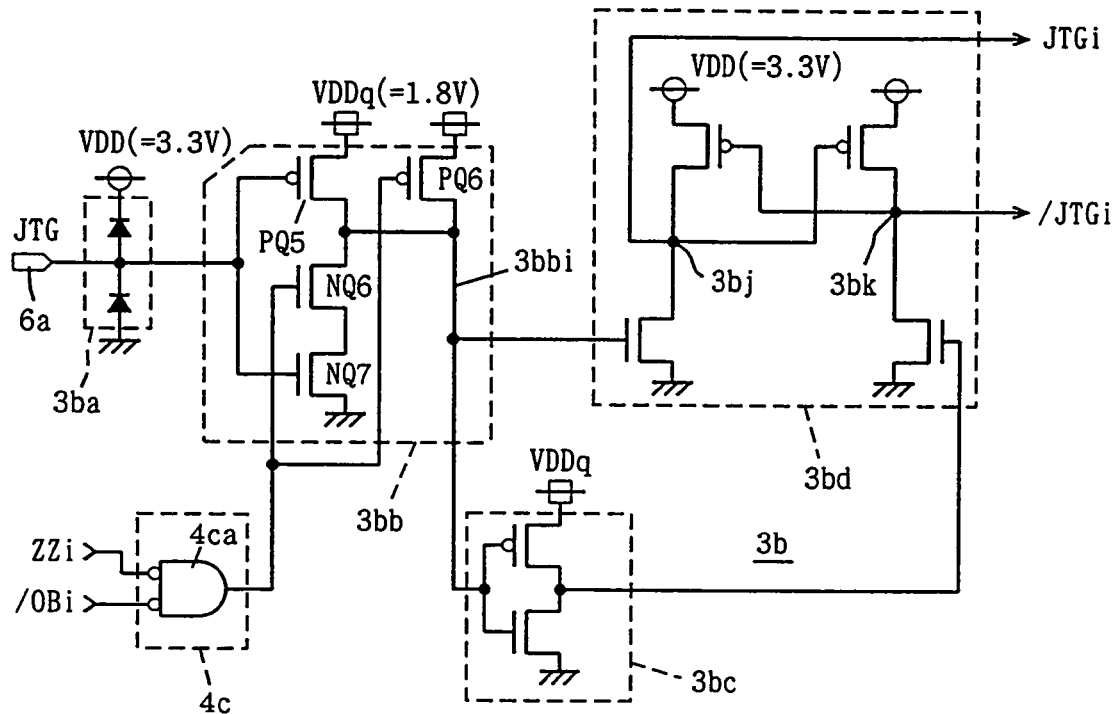
FIG. 7 shows an example of a structure of an input circuit of FIG. 1.

FIG. 7 shows an example of the structure of input circuit 3b in boundary scan test circuit 3 of FIG. 1.

Referring to FIG. 7, control circuit 4c includes a 2-input NOR circuit 4ca receiving an internal snooze mode designation signal ZZi and a complementary input function set signal /OBi. Complementary internal function set signal /OBi is output from the circuit shown in FIG. 3. Internal snooze mode designation signal ZZi is output from the mode set circuit of FIG. 4.

Input circuit 3b includes an input protection circuit 3ba for protecting the internal circuit against excessive voltage applied to pad 6a, a 2-input NAND circuit 3bb receiving signal JTG on pad 6a and the output signal of control gate 4c, an inverter 3bc for inverting the output signal of NAND circuit 3bb, and a level conversion circuit 3bd for converting the voltage level of the output signal of inverter 3bb according to the output signals of NAND circuit 3bb and inverter 3bc.

Input protection circuit 3ba includes a diode connected between pad 6a and the power supply node, and a diode connected between pad 6a and the ground node. Input protection circuit 3ba has a structure similar to that of the input protection circuit shown in FIGS. 3 and 4. Power supply voltage VDD is applied to input protection circuit 3ba.

2-input NAND circuit 3bb includes a p channel MOS transistor PQ5 connected between the power supply node receiving power supply voltage VDDq and an output node 3bbi and having a gate coupled to pad 6a, n channel MOS transistors NQ6 and NQ7 connected in series between output node 3bbi and the ground node, and p channel MOS transistor PQ6 connected between the node receiving power supply voltage VDDq and the output node and receiving the output signal of control gate 4c at its gate. MOS transistor NQ6 receives the output signal of control gate 4c at its gate. MOS transistor NQ7 has its gate coupled to pad 6a.

Inverter 3bc has a structure of a CMOS inverter formed of a p channel MOS transistor and an n channel MOS transistor. Inverter 3bc operates with power supply voltage VDDq being one operating power supply voltage.

Level conversion circuit 3bd converts the VDDq level of the signal output from NAND circuit 3bb to the level of voltage VDD (=3.3 V) to output a complementary internal input signal /JTGi. An internal signal JTGi of a logic identical to that of the signal on pad 6a is output from node 3bj. Signals JTGi and /JTGi are applied to boundary scan test control circuit 3c of FIG. 1. The structure and operation of level conversion circuit 3bd are similar to those of level conversion circuits 4ad and 4bd shown in FIGS. 3 and 4. The operation of level conversion circuit 3bd will now be described.

(i) Sealed in BGA Package

When sealed in a BGA package, pad 6a is connected to a corresponding pin terminal. Function set signal /OBi is set at an L level (bonding option). In this state, the output signal from NOR circuit 4ca included in control gate 4c is a signal according to internal snooze mode designation signal ZZi. When internal snooze mode designation signal ZZi attains an L level, NOR circuit 4ca provides an output of an H level. MOS transistor NQ6 is turned on, and MOS transistor PQ6 is turned off. Therefore, internal signals JTGi and /JTGi are generated according to signal JTG applied via pad 6a, to carry out a boundary scan test.

When internal snooze mode designation signal ZZi is set at an H level, the output signal from NOR circuit 4ca in control gate 4c attains an L level. MOS transistor NQ6 is turned off, and MOS transistor PQ6 is turned on. In this state, the output signal of NAND circuit 3bb is fixed at an H level regardless of the state of signal JTG of pad 6a. Accordingly, internal signal JTGi is fixed at an L level, and internal signal /JTGi is fixed at an H level. When internal snooze mode designation signal ZZi attains an H level, a snooze mode is specified. The operation in the internal circuit is entirely ceased.

When sealed in a BGA package, pad 6a is connected to an external pin terminal. Signal JTG attains an H or L level. Therefore, by fixing the voltage level of internal node 3bi to an H level irrespective of the signal potential on pad 6a (or pin terminal) by the control gate 4c, the operation of the circuitry that operates receiving the output signal from NAND circuit 3bb can be ceased (switching operation can be ceased). Therefore, the current consumption in the internal circuit can be entirely reduced. By turning off MOS transistor NQ6 in NAND circuit 3bb, the path through which the through current flows in NAND circuit 3bb can be cut off to reduce current consumption.

(ii) Sealed in QFP Package

When sealed in a QFP package, pad 6a is in a floating state since a pin terminal is not provided thereto. Internal function set signal /OBi is fixed at an H level (refer to FIG. 3). Therefore, the output signal of control gate 4c is fixed at an L level. MOS transistor NQ6 is turned off, and MOS transistor PQ6 is turned on. Output node 3bbi of NAND circuit 3bb is fixed at the level of power supply voltage VDDq. In this state, NAND circuit 3bb is disabled and has the potential level of its output signal fixed independent of the signal potential at pad 6a. Since the potential level of an applied signal is fixed even in the test control circuit following the level conversion circuit 3bb, the internal circuit does not operate and is set to an inactive state (a state equal to snooze mode).

Even when pad 6a is set to a floating state, any erroneous operation can be reliably prevented by setting input circuit 3b to a disabled state (the potential of output signal of 2-input NAND circuit 3bb is fixed) by function set signal /OBi. When pad 6a is at a floating state, current consumption can be reduced by cutting off the current path from the power supply node to the ground node in NAND circuit 3bb.

By controlling the operable/disable state of input circuit 3b on the basis of the logic of internal snooze mode designation signal ZZi and internal function set signal /OBi, current consumption in input circuit 3b can be reliably reduced in a snooze mode when pad 6a is connected to an external pin terminal (sealed in a BGA package).

In a circuit where connection with a pin terminal is determined depending on the sealed package type, the boundary scan test circuit is selectively set to an operable state or a disabled state by the potential of a particular pad. Therefore, erroneous operation when the boundary scan test circuit is not used can be prevented.

By using a 2-input NAND circuit at the input portion of the test circuit to cut off the current path of the input circuit when it is not used and by fixing the potential level of the output signal thereof, current consumption can be reliably reduced. Also, by setting the operable/disable state of the input circuit according to a combination of a snooze mode designation signal and a function set signal, current consumption can be reliably reduced when a snooze mode is used in the case where the pad of the test circuit is connected to a pin terminal.

In the above description, the relationship between the logic level of activation of the internal snooze mode designation signal and internal function set signal /OBi and the operable/disabled state of the internal circuit is only an example. Another logic relationship can be used.

Second Embodiment

Figure 8:
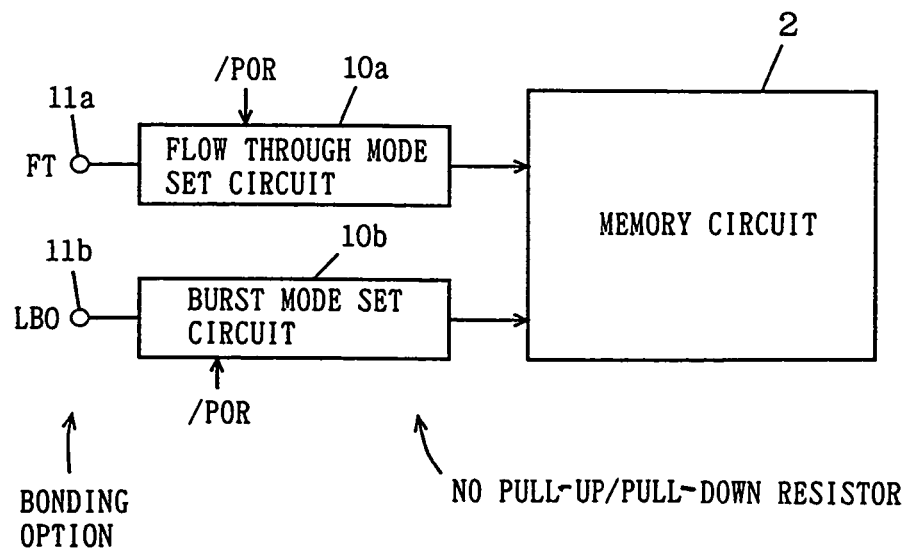
FIG. 8 schematically shows a structure of main components of a semiconductor integrated circuit according to a second embodiment of the present invention.

FIG. 8 schematically shows an entire structure of a semiconductor integrated circuit according to a second embodiment of the present invention. In FIG. 8, a structure of a synchronous burst SRAM is shown. Referring to FIG. 8, the synchronous burst SRAM includes a memory internal circuit 2, a flow through mode set circuit 10a setting a flow through mode of memory internal circuit 2 according to the potential of a signal FT on a pad 11a, and a burst mode set circuit 10b responsive to the potential of signal LBO on a pad 11b to set memory internal circuit 2 to a burst mode. Memory internal circuit 2 has a structure shown in FIG. 13. The output signal of flow through mode set circuit 10a is applied to the output register in memory internal circuit 2. The output register is set to a pipeline or non-pipeline mode according to the potential of signal FT on pad 11a.

Burst mode set circuit 10b provides an output signal to the burst address counter in memory internal circuit 2. Burst mode set circuit 10b responds to the potential of signal LBO on pad 11b to set the burst mode to either the interleaved burst mode or the linear burst mode. Pads 11a and 11b are bonding option pads, having their potential levels determined according to the set operation mode. More specifically, pads 11a and 11b are set to an H level, an L level, or an NC level. Flow through mode set circuit 10a and burst mode set circuit 10b do not include a pull up or pull down resistor. Therefore, when pads 11a and 11b are set to a logic state differing from the output logic of flow through mode set circuit 10a and burst mode set circuit 10b in NC state, the path where the through current of the pull up and pull down resistor flows is cut off to reduce current consumption.

Figure 9:
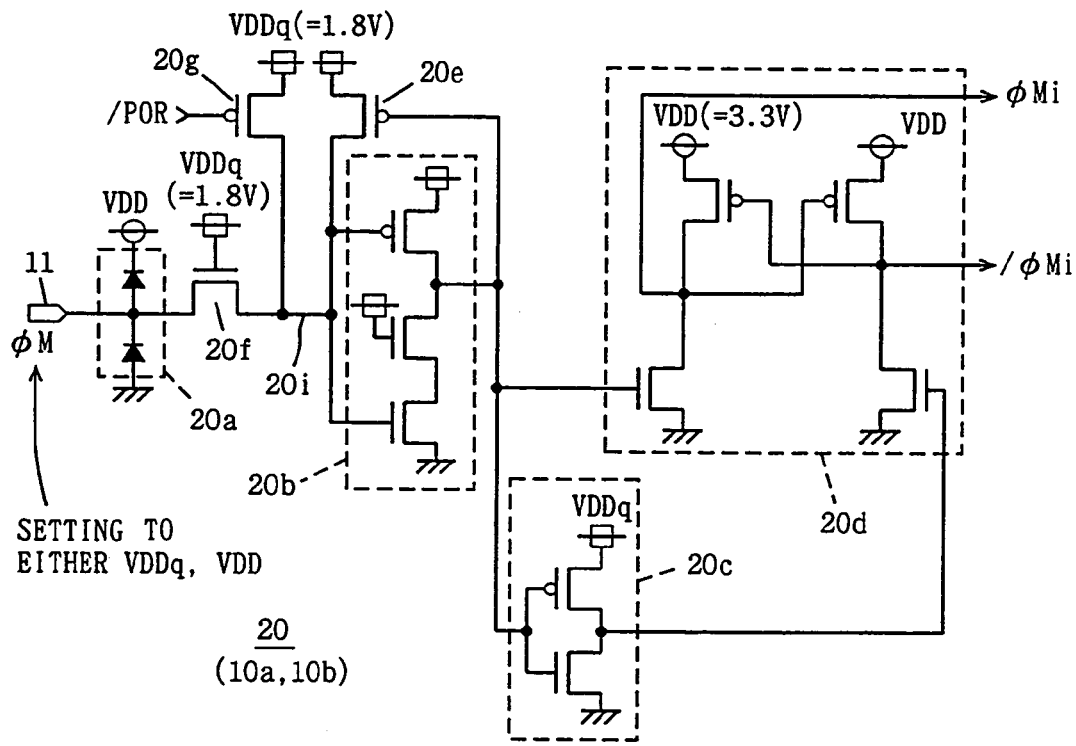
FIG. 9 shows an example of a structure of a flow through mode set circuit and a burst mode set circuit of FIG. 8.
Figure 10:
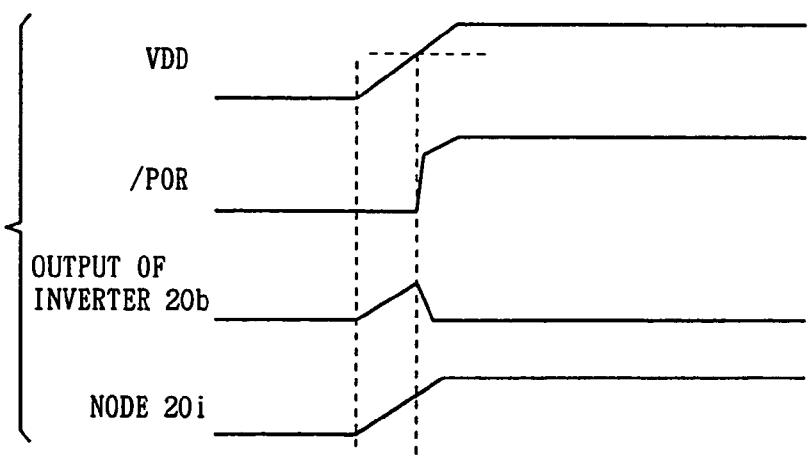
FIG. 10 is a signal waveform diagram representing an operation of the operation mode set circuit of FIG. 9.
Figure 11A:
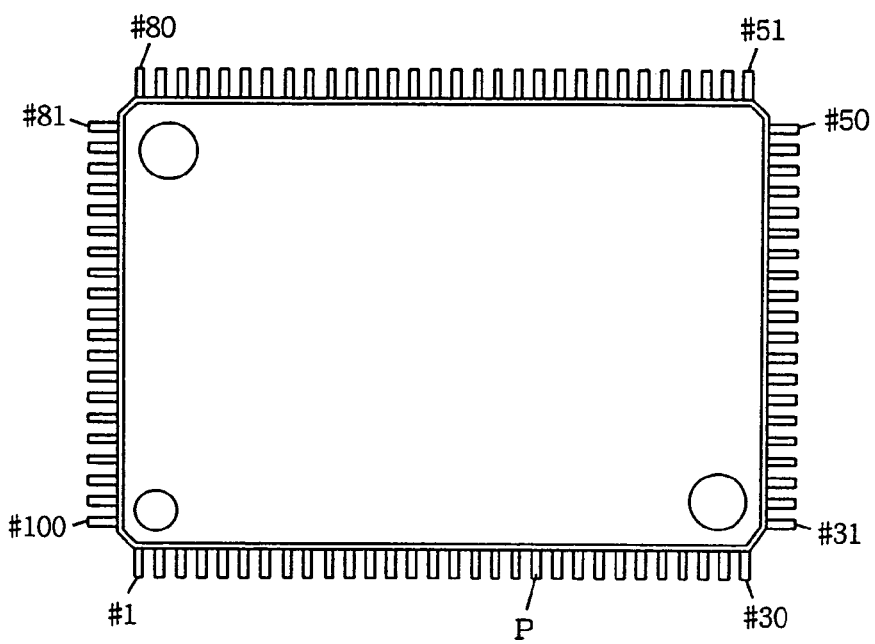
FIG. 11A is a top view.
Figure 11C:
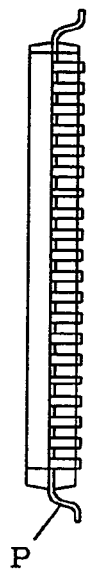
FIG. 11C is a right side view of a QFP package, respectively.
Figure 11B:
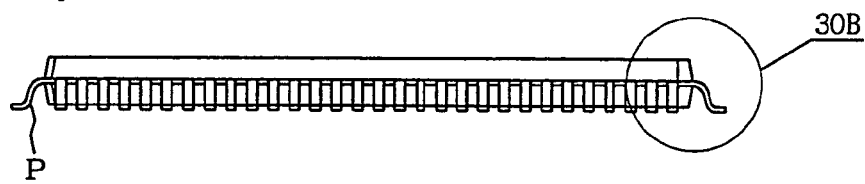
FIG. 11B is a front side view.
Figure 11D:
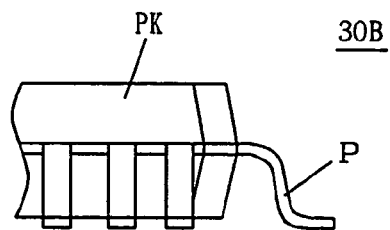
FIG. 11D is an enlargement of a portion 30B of FIG. 11B.
Figure 12A:
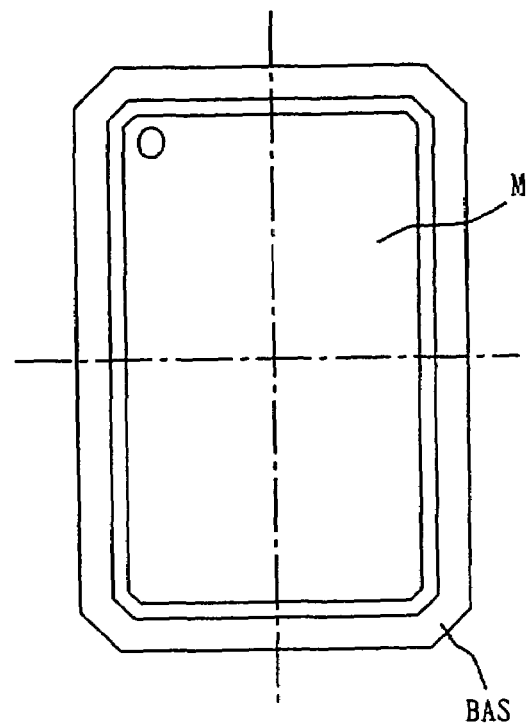
FIG. 12A is a top view.
Figure 12B:
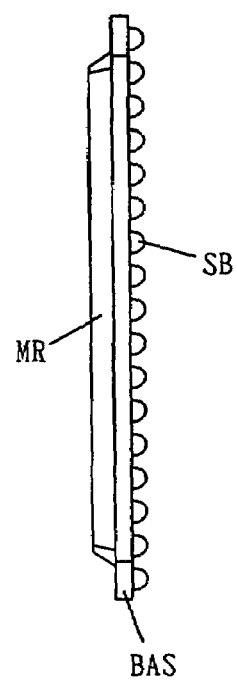
FIG. 12B is a right side view.
Figure 12C:
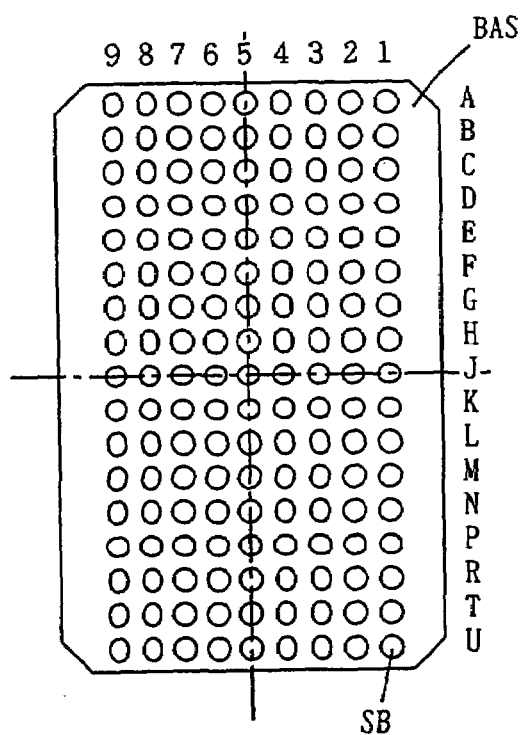
FIG. 12C is a back side view of a BGA package.

FIG. 9 shows an example of a structure of flow through mode set circuit 10a and burst mode set circuit 10b of FIG. 8. Since flow through mode set circuit 10a and burst mode set circuit 10b have the same structure, they will be indicated as an operation mode set circuit 20.

Referring to FIG. 9, operation mode set circuit 20 includes an input protection circuit 20a for absorbing any excessive voltage to pad 11, an n channel MOS transistor 20f receiving power supply voltage VDDq at its gate to pass a voltage lower than power supply voltage VDDq from pad 11 to internal input node 20i, an inverter 20b for inverting a signal on internal input node 20i, an inverter 20c for inverting the output signal of inverter 20b, and a level conversion circuit 20d for converting the voltage level of the signal of inverter 20b according to the output signals of inverters 20b and 20c. Inverters 20b and 20c operate with power supply voltage VDDq being one operating power supply voltage. Level conversion circuit 20d operates with power supply voltage VDD (=3.3 V) being one operating power supply voltage. Level conversion circuit 20d converts the signal having an amplitude of power supply voltage VDDq to a signal having an amplitude of power supply voltage VDD. The structures of inverters 20b and 20c and level conversion circuit 20d are similar to those shown in FIGS. 3 and 4.

Operation mode set circuit 20 further includes a p channel MOS transistor 20e responsive to the output signal of inverter 20 for transmitting power supply voltage VDDq to internal input node 20i, and a p channel MOS transistor 20g responsive to power on detect signal /POR to transmit power supply voltage VDDq to internal input node 20i. Power on detect signal /POR is a signal complementary to power on detect signal POR of FIG. 6. When power supply voltage VDDq becomes higher than a predetermined voltage, power on detect signal /POR is pulled up to an H level. The operation will now be described.

(i) When Pad 11 is Fixed to an H Level:

When pad 11 is fixed to an H level, internal input node 20i is set to an H level via MOS transistor 20f. The output signal of inverter 20b attains an L level. MOS transistor 20e is turned on and internal input node 20i is at an H level, which is latched by inverter 20b and MOS transistor 20e. The output signal of inverter 20b at an L level causes an internal signal φMi from level conversion circuit 20d to attain an H level of power supply voltage VDD. A complementary internal operation mode designation signal /φMi attains an L level of the ground voltage. Signal φM on pad 11 is a flow through mode signal FT or a burst mode control signal LBO. When signal FT is set to an H level, a pipeline operation is carried out to output data in synchronization with a clock signal. When signal φM is a burst mode control signal LBO, a burst address is modified according to the sequence defined by the interleaved burst mode.

When pad 11 is set at an H level, there is no path through which current flows in inverter 20b (stable state). Also, MOS transistor 20g is turned on only for a time period when the power is turned on. Following stabilization of power supply voltage VDDq, the off state of MOS transistor 20g is maintained, so that no current path is present. Even when the voltage level of signal φM on pad 11 is set to, for example, the level of power supply voltage VDD, a signal of the level of only power supply voltage VDDq-Vth is transmitted to internal input node 20i by decoupling MOS transistor 20f. Here, Vth is the threshold voltage of MOS transistor 20f. Therefore, when pad 11 attains a voltage level higher than power supply voltage VDDq, MOS transistor 20f operates with internal input node 20i being a source thereof MOS transistor 20f has source and gate attain the same voltage level to maintain an off state. The current path is cut off. Therefore, no path through which current flows is present in this state, so that current consumption is reduced.

(ii) When Pad 11 is Set to an L Level:

When pad 11 is set to an L level of the ground voltage, internal input node 20i is set to an L level. The output signal of inverter 20b attains an H level. Internal operation mode designation signal φMi from level conversion circuit 20d is similarly pulled down to an L level. Complementary internal operation mode designation signal /φMi attains an H level. In this case, MOS transistor 20e is turned off. When internal input node 20i is set to an L level, there is no path through which current flows from the power supply node to the external terminal via pad 11.

CMOS inverter 20c and level conversion circuit 20d exhibit the feature inherent to a CMOS circuit in a stable state. Since all the MOS transistors are turned off, no current flows.

When pad 11 is set to an L level, a flow through operation is carried out in the memory internal circuit or output data is read out in a pipeline manner for flow through mode signal FT, while the burst address is updated according to the linear burst mode for a burst mode control signal LBO.

(iii) When Pad 11 is at a Floating State:

Power on detect signal /POR maintains an L level after power supply voltage VDD is applied and until power supply voltage VDD reaches a predetermined voltage level (refer to circuit of FIG. 5). Therefore, MOS transistor 20g is turned on during this period. Node 20i is charged via MOS transistor 20g to rise according to the increase of the level of power supply voltage VDDq. Under this state, the input logic threshold value of inverter 20b is not exceeded by the voltage level of internal input node 20i. Therefore, the potential of the output signal of inverter 20b rises together with the rise of the level of the power supply voltage.

When the voltage of node 20i exceeds the input logic threshold of inverter 20b, the output signal of inverter 20b falls to an L level. MOS transistor 20e is turned on. Internal input node 20i is charged via MOS transistor 20e. Therefore, even when power on detect signal /POR is pulled up to an H level and MOS transistor 20g is turned off, internal input node 20i is latched at an H level by inverter 20b and MOS transistor 20e. Particularly in the case where power supply voltage VDD is higher than power supply voltage VDDq of inverter 20b and the charging level of internal input node 20i is set approximately to the predetermined voltage level of power supply voltage VDD, the output signal of inverter 20b can be reliably driven to an H level so that internal input node 20i can be maintained at the level of power supply voltage VDDq by the latch circuit formed of MOS transistor 20e and inverter 20b.

Therefore, even when pad 11 is at an NC state and in at a floating state, internal input node 20i is reliably set to an H level. After internal input node 20i is set to the H level of power supply voltage VDDq, MOS transistor 20e maintains an off state because the source and drain voltage are the same. Therefore, there is no path where the current flows. Thus, current consumption is reduced.

In this case, a state similar to that where pad 11 is fixedly set to an H level is realized.

When signal φM is driven to an L level from an H level according to the circuit shown in FIG. 9, current flows from MOS transistor 20e via MOS transistor 20f and pad 11 only immediately after input signal φM is driven to an L level from an H level since MOS transistor 20e is on when signal φM is at an H level. However, when inverter 20b operates so that the gate voltage level of MOS transistor 20e rises to an H level (level of power supply voltage VDDq), MOS transistor 20e is turned off, so that the current where through current flows constantly is cut off. Therefore, according to the structure of operation mode set circuit 20 of FIG. 9, reduction in current consumption can be realized in the case where the voltage level is switched under control of an external device as well as in the case where the voltage level of pad 11 is fixed.

When MOS transistor 20f is used, no current flows is input protection circuit 20a even when a voltage of approximately 3.3 V is applied to pad 11. Also, only a voltage of a level of power supply voltage VDDq passes internal input node 20i by MOS transistor 20f. When MOS transistor 20f is not provided, MOS transistor 20e is turned on when signal φM is set to the level of power supply voltage VDD. Current flows from the external pin terminal towards the power supply voltage VDDq via pad 11 and MOS transistor 20e.

Therefore, MOS transistor 20f can be operated as a decoupling transistor to allow the voltage level of pad 11 to be set to 1.8 V or 3.3 V. In other words, when connection is made to an external pin terminal, the level of signal φM can be set to the voltage level of either power supply voltage VDD or power supply voltage VDDq. Therefore, the power supply voltage that can be most easily used can be applied in the wiring on the board where the power supply line layout is complicated, to increase the degree of freedom of the board design.

This is because in many cases, the burst mode of the synchronous burst SRAM is fixedly set, and that the flow through mode is set to a state of specifying a pipeline operation in the employed system.

According to the second embodiment, in the structure in which the internal operation mode is set by the pad potential, the internal input node is set to an H level by a latch circuit formed of an inverter and an MOS transistor, and a decoupling transistor is provided between this internal input node and the pad. Therefore, the current flow path can be cut off regardless of the state of the pad to reduce current consumption. Also, the provision of this decoupling transistor allows the voltage level of pad 11 to be set to either power supply voltage VDD or VDDq. This connection can be determined according to the power supply wiring layout on the board to increase the degree of a freedom of the board design.

In the structure of FIG. 9, an internal snooze mode designation signal is not used. This is because, when the semiconductor integrated circuit (synchronous burst SRAM) is used in the system implementation, the voltage level of pad 11 is often fixed in practical usage. In this state, there is no path through which through current flows in the burst mode set circuit, and it is not particularly necessary to cut off the through-current flowing path.

Pad 11 is described to attain a floating state in the above description. However, pad 11 can be bonded to a corresponding external pin terminal, which in turn is set to an NC state.

In a synchronous burst SRAM, a flow through mode control signal FT# and a burst mode control signal LBO# are allocated in both the packages of QFP and BGA. An NC state normally corresponds to the state where the external pin terminal is in a floating state.

[Other Applications]

In the previous description, a synchronous burst SRAM is taken as example for the semiconductor integrated circuit. An advantage similar to that of the first embodiment can be obtained for any semiconductor integrated circuit sealed in either a QFP package or a BGA package. A boundary scan test circuit is required when sealed in a BGA array. In this case, if a power down mode to stop the internal circuit operation such as a snooze mode is not provided, the logic gate has the state of the operation manner (input circuit) determined by the output signal of the function set circuit. In this case, the test input circuit has a structure similar to that of the operation mode set circuit shown in FIG. 4 or 9.

The operation mode set signal is not limited to the above-described flow through mode or a burst mode signal, and can be a signal of another operation mode. The first and second embodiments can be applied to any structure in which the internal operation mode is set by the potential of the bonding option pad.

In the above description, a BGA package is employed. However, any format can be employed as long as solder balls (bumps) are arranged in a two dimensional array.

According to the present invention, a semiconductor integrated circuit that operates stably and at low power consumption can be realized independent of the employed package type and operation mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a pad;
   a first transistor for setting said pad to a voltage level of a first logic level in response to application of a power supply voltage to power up said semiconductor integrated circuit;
   an inverter for inverting a logic of a potential on said pad; and
   a second transistor connected in parallel to said first transistor, and receiving an output signal of said inverter at a control electrode node thereof;
   an operation mode of an internal circuit being specified by an output signal of said inverter.

2. The semiconductor integrated circuit according to claim 1, further comprising a transfer gate inserted between said pad and an input of said inverter, receiving a fixed potential at a control electrode node thereof.

3. The semiconductor integrated circuit according to claim 1, further comprising a protection circuit coupled to said pad for absorbing an excess voltage higher in absolute value than a first power supply voltage generated at said pad, and wherein
   said inverter operates using a second power supply voltage lower in absolute value than said first power supply voltage as an operating power supply voltage.

4. The semiconductor integrated circuit according to claim 3, further comprising a transfer gate connected between said protection circuit and an input of said inverter and receiving said second power supply voltage at a control gate thereof.

5. The semiconductor integrated circuit according to claim 4 wherein the first and second transistor are connected in parallel between the input of said inverter and a node supplying said second power supply voltage.

6. The semiconductor integrated circuit according to claim 1, wherein said inverter operates using a first power supply voltage as one operating power supply voltage, and said semiconductor integrated circuit further comprises a level converter for converting an amplitude of the output signal of said inverter to an amplitude of a second power supply voltage higher than the first power supply voltage.

7. The semiconductor integrated circuit according to claim 1, wherein said paid comprises a bonding option pad.

* * * * *